(12) United States Patent
Steinbrecher

(10) Patent No.: US 7,679,410 B1
(45) Date of Patent: Mar. 16, 2010

(54) SYSTEM AND METHOD FOR IMPROVING THE EFFICIENCY AND RELIABILITY OF A BROADBAND TRANSISTOR SWITCH FOR PERIODIC SWITCHING APPLICATIONS

(75) Inventor: Donald H. Steinbrecher, Brookline, MA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 60 days.

(21) Appl. No.: 12/287,158

(22) Filed: Sep. 29, 2008

(51) Int. Cl.
*H03B 1/00* (2006.01)
*H03K 17/60* (2006.01)
(52) U.S. Cl. .................. 327/108; 327/478; 327/489
(58) Field of Classification Search .......... None
See application file for complete search history.

(56) References Cited

U.S. PATENT DOCUMENTS

| 3,946,326 A | * | 3/1976 | Minner et al. ............... 330/291 |
| 3,999,142 A | * | 12/1976 | Presser et al. ............... 330/286 |
| 4,443,719 A | | 4/1984 | Planer et al. |
| 4,645,945 A | | 2/1987 | de Sartre |
| 5,262,684 A | * | 11/1993 | Kashiwagi .................. 327/108 |
| 5,276,357 A | | 1/1994 | Cripe |
| 5,530,385 A | | 6/1996 | Miettinen |
| 5,686,854 A | | 11/1997 | Smith |
| 5,784,692 A | * | 7/1998 | Kleinberg .................. 455/333 |

* cited by examiner

*Primary Examiner*—Tuan Lam
(74) *Attorney, Agent, or Firm*—James M. Kasischke; Michael P. Stanley; Jean-Paul A. Nasser

(57) ABSTRACT

A driver circuit is provided for enabling a transistor collector-emitter path to be used as a broadband periodic switch. The broadband driver circuit controls the magnitude of the transistor base-emitter current in order to enable a CLOSED switch state and to simultaneously control the magnitude of the transistor base-emitter reverse-bias voltage in order to enable the OPEN-switch state. The precise control of these parameters minimizes base-charge storage and prevents reverse-breakdown failure.

7 Claims, 18 Drawing Sheets

SYSTEM AND METHOD FOR IMPROVING THE EFFICIENCY AND RELIABILITY OF A BROADBAND TRANSISTOR SWITCH FOR PERIODIC SWITCHING APPLICATIONS

STATEMENT OF GOVERNMENT INTEREST

The invention described herein may be manufactured and used by or for the Government of the United States of America for governmental purposes without the payment of any royalties thereon or therefor.

CROSS-REFERENCE TO RELATED APPLICATIONS

The application submitted herein is related to: U.S. patent application Ser. No. 12/022,506, filed on Jan. 30, 2008 entitled "A Method for Coupling a Direct Current Power Source Across a Dielectric Membrane or Other Non-Conducting Membrane" and U.S. patent application Ser. No. 12/022,537 filed on Jan. 30, 2008 entitled "A Method for Coupling a Direct Current Power Source Across a Nearly Frictionless High-Speed Rotation Boundary". Both applications are by the inventor, Dr. Donald H. Steinbrecher.

BACKGROUND OF THE INVENTION (1) Field of the Invention

The present invention relates to a system and method of use for a broadband transistor switch in periodic switching applications.

(2) Description of the Prior Art

Sensor systems located along fixed or towed tethers need to transmit sensor data to certain types of airborne platforms and certain types of floating sensor systems. Direct Current (DC) power for operation is difficult to supply because of the long length and/or the small size of the sensor tethers. Alternatively, networked sensor systems may comprise thousands of individual sensors, each of which requires power for command, control and communications. Thus, system power at the sensor is at a premium and efficient, reliable, transmitter design is critical to the long term operation of tethered and untethered sensor systems.

In Planer et al. (U.S. Pat. No. 4,443,719), a voltage isolated gate drive circuit for insulated gate semiconductors utilizes a small, inexpensive pulse transformer to provide a rectangular drive wave form. The small pulse transformer can be operated with an input square wave form at relatively low frequencies, such as 60 hertz, and can be operated from a common power supply with the high voltage supplied to the output field effect transistor.

In de Sartre (U.S. Pat. No. 4,645,945), a switching control circuit is provided for power transistors controlling an inductive load. To avoid oversaturation of the transistor, causing excessive consumption and a switching difficulty on opening, said transistor is caused to operate at the limit of saturation, by means of an emitter resistor, a quasi current mirror in parallel across said resistor, another current mirror and a current amplifier. The current from said first current mirror is controlled on or off by a square wave generator such as those used in chopped power supplies or television scanning circuits for which the invention is particularly appropriate.

In Cripe (U.S. Pat. No. 5,276,357), a drive circuit generates a quasi-square wave for use in switching power amplifiers by supplying square wave signals which are 180 degrees out of phase, but otherwise identical, to the respective control inputs of two switching transistors. Opposite ends of the respective controlled paths of the transistors are connected to the input of the device which is being driven. The driven device input has a capacitance associated therewith, which normally results in a voltage loss as this capacitance is alternately charged and discharged. The circuit component values are selected so that this capacitance is charged while the switching transistors have yet to reach their threshold voltages, and thus at the moment when either transistor is switched to a conducting state the voltage across that transistor's controlled path will be substantially zero, and the normal switching loss, which is a product of the square of that voltage, the input capacitance of the driven device, and the operating frequency, is eliminated.

In Miettinen (U.S. Pat. No. 5,530,385), the invention relates to a control circuit for a semiconductor switch, comprising a transformer coupling (T1, T2) for generating AC voltage signals including both control energy and control information, a rectification coupling (DB1, DB2) for rectifying the AC voltage signals generated by the transformer coupling (T1, T2) for generating DC voltage levels (U1, U2, U3) appropriate for turning on and turning off a semiconductor switch (SW1), a first resistor (R2) connected at its first end to a driving electrode of the semiconductor switch (SW1), a second resistor (R1) connected between the driving electrode and the emitter of source electrode of the semiconductor switch, and a booster semiconductor switch (V1) provided between the driving electrode of the semiconductor switch (SW1) and a DC voltage output (U3) generated by the rectification coupling and intended for turning off the semiconductor switch, the driving electrode of the booster semiconductor (V1) being connected to a DC voltage output (U3) generated by the rectification coupling and intended for controlling the booster semiconductor. The control circuit further comprises a zener diode (V2) connected between a second end of the first resistor (R2) and a DC output (U1) generated by the rectification coupling and intended for turning on the semiconductor switch (SW1) and a diode (V4) connected in a forward direction between the turn-off voltage output (U3) of the rectification coupling and the emitter or source electrode of the semiconductor switch (SW1).

In Smith (U.S. Pat. No. 5,686,854), a driver circuit for high frequency transistor type switches, comprising two sections; a positive (+) drive and a negative (−) drive, both sections being supplied with a high frequency signal by a square wave oscillator source. The sections are connected in parallel to a control generated input drive signal. In the negative drive section, the input drive signal is first inverted before being processed. Each section contains precise circuits for routing a high frequency carrier signal, for increasing input drive signal power gain, for providing independent positive and negative slope control, for providing exceptionally high voltage and noise isolation to avoid transmission of harmful voltages or noise, and for delivering a positive or negative drive signal to the gate/emitter of an external transistor under drive. The invention is characterized by its high voltage and noise isolation, using a few components and being small in size.

SUMMARY OF THE INVENTION

It is therefore a general purpose and primary object of the present invention to provide a driver circuit for a switching transistor in which the switching transistor is capable of use in a periodic switching application.

To attain the object described, a basic concept underlies the present invention. In order to build an efficient modulator that uses a nearly ideal switch; it is necessary to build the switch.

One method for building the switch is to employ the same concept recognizing that a base-emitter junction of a transistor is a diode. Thus, the concept is used to drive the transistor base-emitter junction (as will be discussed further in this disclosure) in order to use the transistor as a switch in the modulator application.

The concept is that an ideal switch can be used to efficiently convert a DC power source to a square-wave and that an ideal diode can be used to convert a square-wave source to DC. A nearly ideal switch can be emulated by the collector-emitter path of a transistor. Recognizing that the base-emitter junction is a diode, allows the basic concept to be employed to convert the transistor to be employed to convert the transistor into a nearly ideal switch.

This concept allows precision control of the base-emitter current in the "ON" state of the switch and allows precision control of the base-emitter reverse bias in the "OFF" state of the switch. If the "ON" state base-emitter current is too large, excess charge is stored in the transistor, which slows the switching process when the transistor is switched from "ON" to "OFF". If the base-emitter reverse bias is too large in the "OFF" state, the transistor may fail catastrophically. Thus the use of the basic concept is to provide precision control of the transistor switching parameters which is essential to the operation of the transistor as an efficient switch. Furthermore, the present invention protects the switching transistor and optimizes switching performance by permitting independent and precise control of a transistor base current and base-emitter-junction reverse-bias voltage.

A "transistor is a three-terminal device with significant current gain. The names given to the three terminals are "collector", "emitter", and "base". A unit of current flowing in the base-emitter circuit may cause one hundred or more units of current to flow in the collector-emitter circuit. The ratio of base current to collector current is linear over much of the operating region of the device and is referred to as the BETA of the transistor. The BETA of high-power switching transistors that would be used in the disclosed circuits ranges from approximately fifty to approximately two hundred.

The disclosure describes a method for using a transistor as a periodic switch with low "ON" state resistance and high "OFF" state resistance. When a transistor is used as a switch, it is necessary to precisely control the base-emitter current so that, in the ON state, excess charge is stored in the base-emitter junction is minimized and it is also necessary, in the OFF state to precisely control the base-emitter reverse bias voltage. If excess charge is stored in the base-emitter junction, switching latency is increased. If the base emitter reverse bias limits are exceeded, the transistor may be destroyed. The method of this disclosure permits precision control of the ON state base-emitter current and of the OFF state base-emitter reverse bias in order to optimize the performance of the transistor as a switch and preserve the life time of the transistor in this application.

Most semi-conductors are known as one of two types: 1) P-type in which the current transport mechanism is "holes" and 2) N-type in which the primary current transport mechanism is "electrons". Transistors are three-layer devices and can be grown in either P-N-P layers or N-P-N layers. Diodes are two-layer devices and may be grown as "N" on a "P" substrate or "P" on a "N" substrate.

The properties of NPN and PNP transistors are nearly identical except for the directions of current flow and voltage polarity when the devices are active. These terms are well known to those ordinarily skilled in the art. A high-power, PNP transistor shunt periodically driven switch can be used with certain modulator applications. A NPN transistor is provided which switches between an OPEN circuit and a SHORT circuit to modulate the current through a switch load.

Two important collector-emitter circuit properties of a transistor switch are 1) the peak-to-peak voltage swing permitted in the "OFF" state and 2) the peak-to-peak current permitted in the "ON" state. The "OFF" state peak-to-peak voltage swing is limited on one end by zero volts and on the other end by the collector-emitter breakdown voltage, which is a property of the transistor and not of the driver circuit. The "ON" state peak-to-peak current swing is limited on one end by zero current and on the other end by the magnitude of the base-emitter current supplied by the driver circuit, which is a property of the drive circuit. In an ideal switching application, the base-emitter current supplied by the driver circuit will be just adequate to support the peak collector-emitter current in order to avoid over-driving the base emitter junction.

The transistor switch may be configured for use in 1) a single-ended, or shunt mode or in 2) a balanced, or series mode. The method disclosed herein supports the shunt mode and the series mode of operation. A shunt-mode switch is usually configured using only one PNP or NPN transistor with emitter connected to the circuit common ground. A series mode switch is usually configured with one PNP and one NPN transistor connected emitter-to-emitter so that the base-emitter current of the PNP transistor is the same as the emitter-base current of the NPN transistor. The base-emitter-emitter-base connection appears as two diodes connected in series and acting as a single diode. The method of this application can then be used to drive this single diode and to create a balanced square-wave drive that can be passed through a transformer because there is no average DC current required to drive the series switch. Thus, the method described herein allows the use of a transformer to absorb the common-mode voltage of the circuit allowing the series switch to appear to float in the switching application.

There are many engineering applications for efficient periodic switching circuits that may use the disclosed method. One application for the switch driver circuit is for the design of a broadband amplitude-phase-frequency modulator, using simplified circuits, which are comparatively inexpensive and realized with conventional electronic components. The efficiency would be nearly one hundred percent if all of the system components were ideal. In practice, the current gain and saturation voltage of the power transistor if used as a switch will limit the modulator efficiency. In some systems that require narrow-band transmission, approximately nineteen percent of the transmit power may be lost in harmonic filters that precede the antenna.

A novel feature of the disclosed circuit design is that the combination of circuit elements comprising the base-emitter drive circuit presents a matched termination to a square wave. Thus the length of the transmission line that connects the base-emitter drive circuit to a square-wave source will not affect the switching characteristics of the periodic transistor switch. The practical importance of the matched condition is that the primary source of the square wave drive may be located a significant distance from the location of the transistor switch. In one embodiment, the transistor switch may be located adjacent to an antenna so that the maximum RF power generated by the periodic switching action will be radiated while the modulation source is located in a protected shelter and connected to the high-power transistor switch by means of a transmission line. If the transmission line were mismatched, then standing waves on the transmission line would affect the switching properties, which would in turn limit the frequency band of operation.

Another novel feature of the disclosed circuit design is that the transistor switching properties and the matched condition of the drive circuit to a square wave can be realized over a wide instantaneous bandwidth. The reactive elements in the disclosed circuit, the inductors and capacitors, are used as energy storage devices and not as resonant elements. The energy storage properties of high quality components extend over very wide bandwidths. The energy storage properties of inductors and capacitors are degraded by parasitic elements, which are device specific.

If ideal components without parasitic elements were used in the disclosed circuits, the instantaneous bandwidth of operation would be nearly unlimited. The parasitic elements that will ultimately limit the instantaneous bandwidth of operation fall into several categories. For example, the parasitic distributed capacitance of an inductor limits the frequency band of operation over which the inductor behaves as an inductor. Similarly, the parasitic inductance of a capacitor will ultimately limit the frequency band of operation over which the capacitor will behave as a capacitor. Real inductors and real capacitors also have parasitic losses that limit the ability to recover the energy stored on the devices and these parasitic losses will limit the efficiency of the disclosed circuits. Finally, the disclosed operation is described without regard to the parasitic elements of the ideal transistor. Here again, the practical limitations of the design will depend on the quality of the transistor used in the application. Thus, for the purposes of this disclosure, there is no attempt to quantify the bandwidth or the actual efficiency of the disclosed circuits since these properties are dependent on parasitic elements and can be evaluated by those ordinarily skilled in the art.

BRIEF DESCRIPTION OF THE DRAWINGS

A more complete understanding of the invention and many of the attendant advantages thereto will be readily appreciated as the same becomes better understood by reference to the following detailed description when considered in conjunction with the accompanying drawings wherein like reference numerals and symbols designate identical or corresponding parts throughout the several views and wherein.

DETAILED DESCRIPTION OF THE INVENTION

The description of a switch driver design is presented in five sections. In a first section, concepts are introduced that explain circuit operation in the following sections. In a second section, the operation of an energy efficient square-wave generator is disclosed. The square-wave generator circuit provides a foundation for the amplitude-phase modulator design disclosed in a fifth section. In a third section, an energy efficient [square-wave]-to-DC converter is disclosed, which provides a foundation for the switch driver design disclosed in a fourth section.

Introduction to the Disclosed Method

Figure 1:
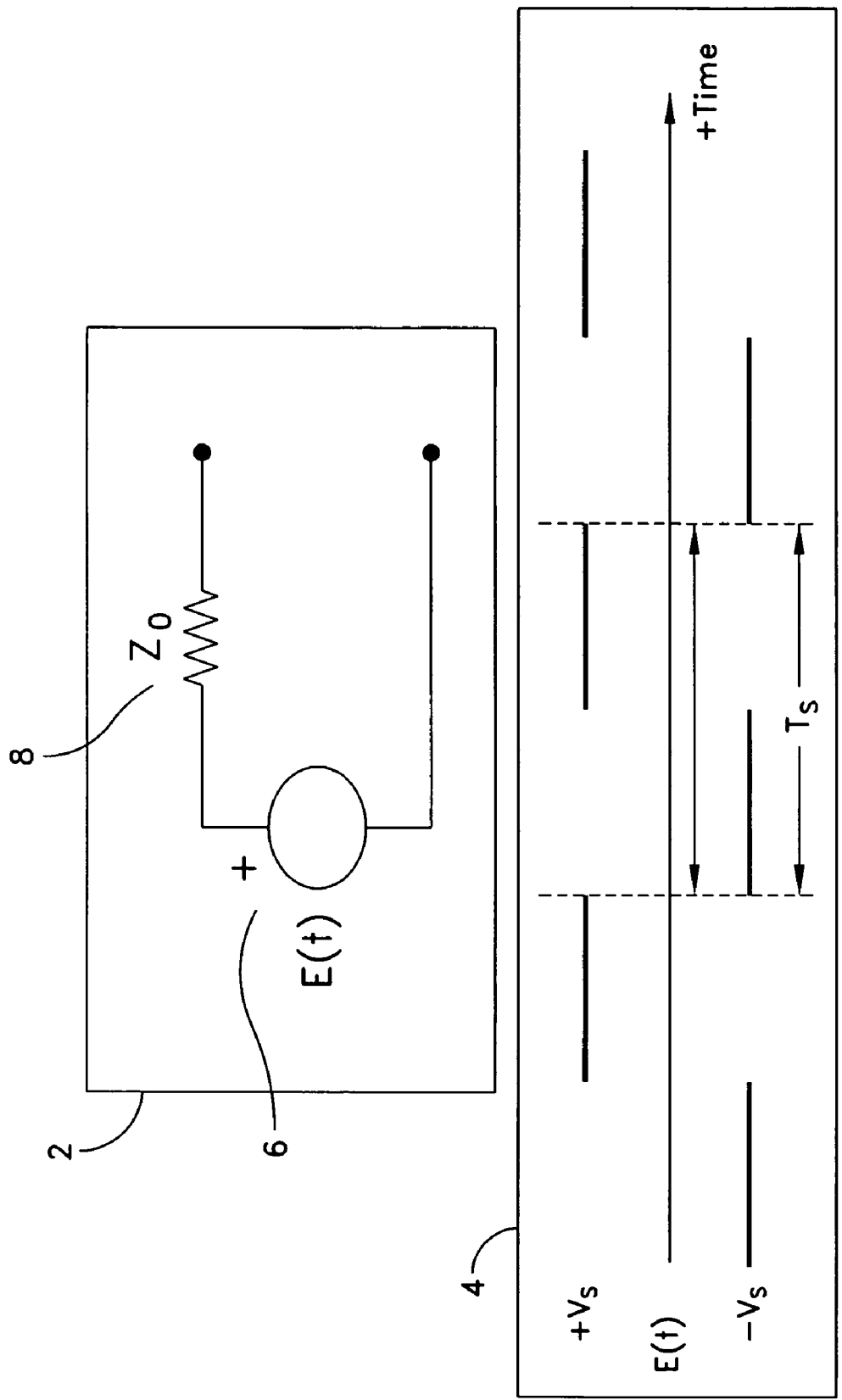
FIG. 1 depicts a Thevenin-Equivalent square-wave source.

In FIG. 1, a Thevenin-Equivalent source 2 is shown. A voltage 4 of a signal generator 6 switches between a positive state, $+V_S$ and a negative state, $-V_S$, in which the states have the same magnitude but opposite polarity. The switching operation is periodic with a period, $T_S$, and with equal dwell times in each state. Thus, the average value of the generator voltage is zero. Furthermore, the time required to switch between the two states is negligible and is assumed for calculation purposes to be zero. This equivalent circuit may be used to represent the output of a transmission line of any length and having a characteristic impedance equal to $Z_0$.

A characteristic impedance 8 of the Thevenin-Equivalent generator is $Z_0$, a positive real number. In general, a discernible and recognizable Thevenin-Equivalent source impedance can be complex and may, under certain circumstances, have a negative real part. However, for the purposes of this disclosure, only positive real values of $Z_0$ are considered. This restriction is consistent with practical applications of the disclosed method.

Figure 2:
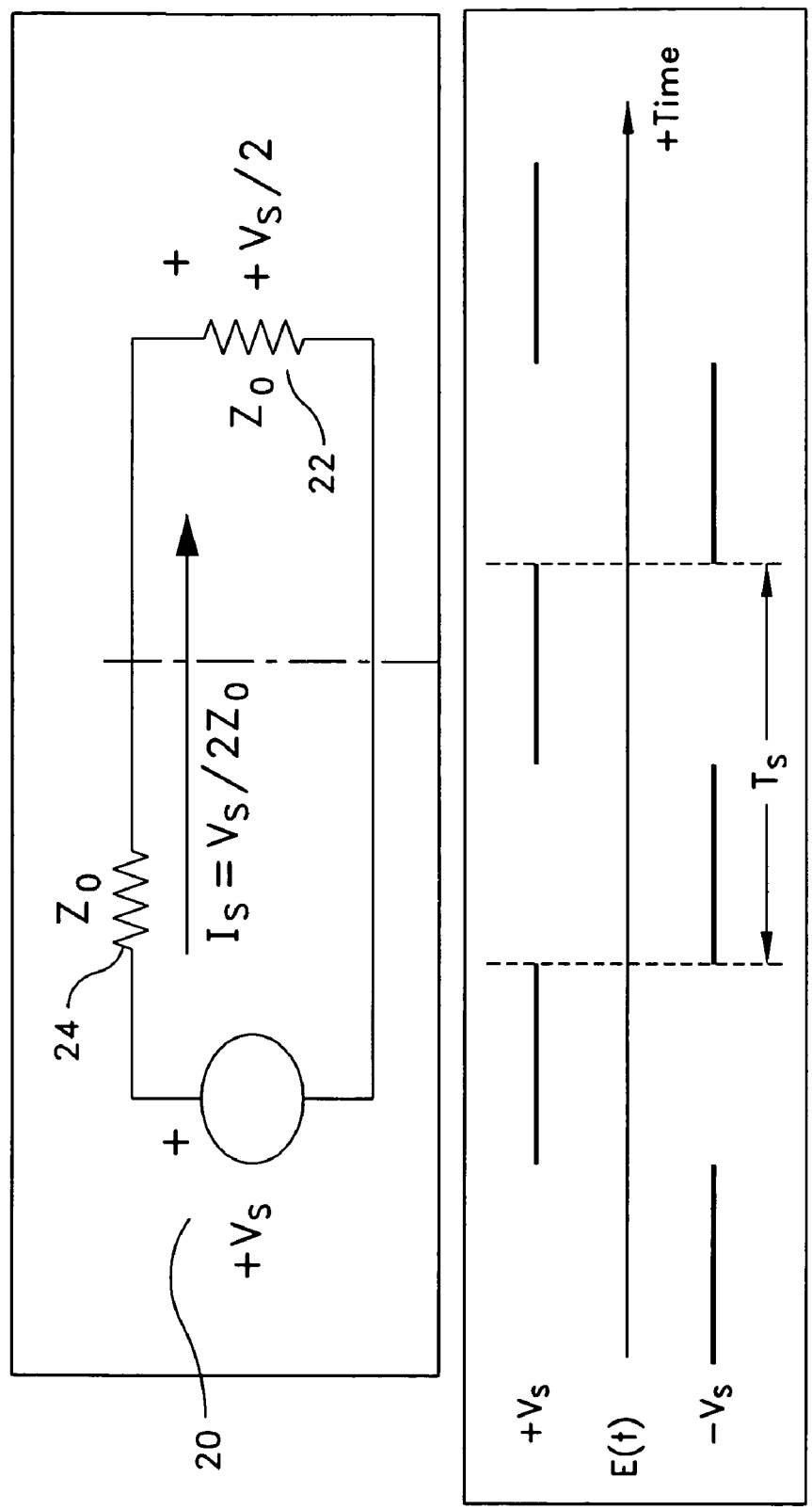
FIG. 2 depicts an optimally loaded square-wave source.

The maximum power available from the Thevenin-Equivalent circuit of FIG. 1 is equal to the power that would be delivered to a load resistor equal to $Z_0$ as illustrated in FIG. 2. In the figure, maximum power transfer occurs when a generator 20 is driving a load that is equal to the source impedance of the generator. A load of a load resistor 22 is $Z_0$, which is equal to a source impedance 24 of the generator 20. Under these conditions, the voltage across the load is one half of the voltage of the generator 20 and the current is one half of the short-circuit current available from the Thevenin-Equivalent generator.

Figure 3:
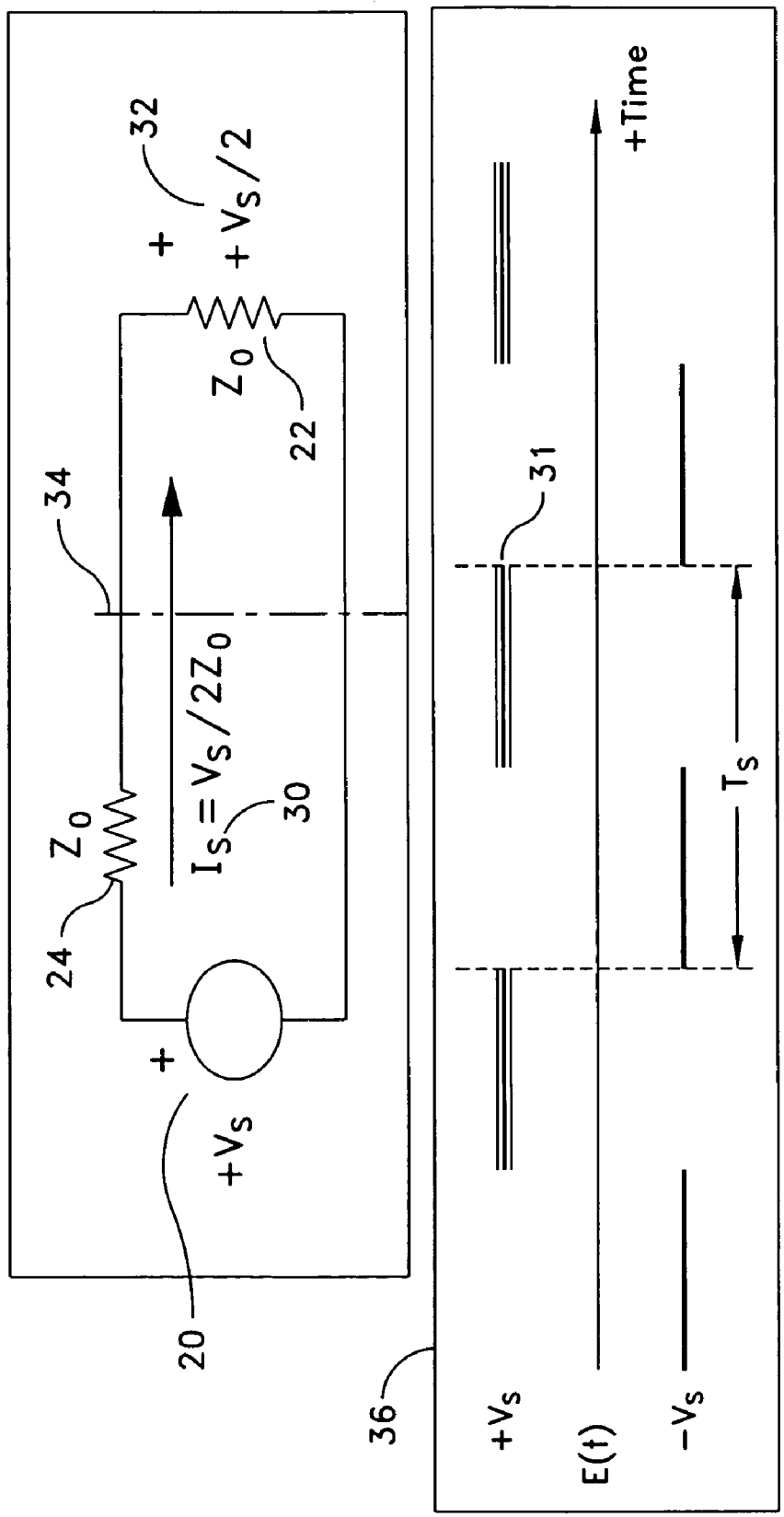
FIG. 3 depicts a square-wave source, positive half period.

During a positive state of the generator 20, illustrated in FIG. 3, a current 30 passing through a load, $Z_0$, is $V_S/2Z_0$ so that the instantaneous power delivered to the load of the load resistor 22 is $(V_S)^2/4Z_0$.

During a positive half period 31 of the square-wave cycle, the current 30 is positive and equal to the peak voltage of the generator 20 divided by a total circuit resistance $2Z_0$, and a voltage 32 across the load is one half of the peak voltage ($V_S$).

Figure 4:
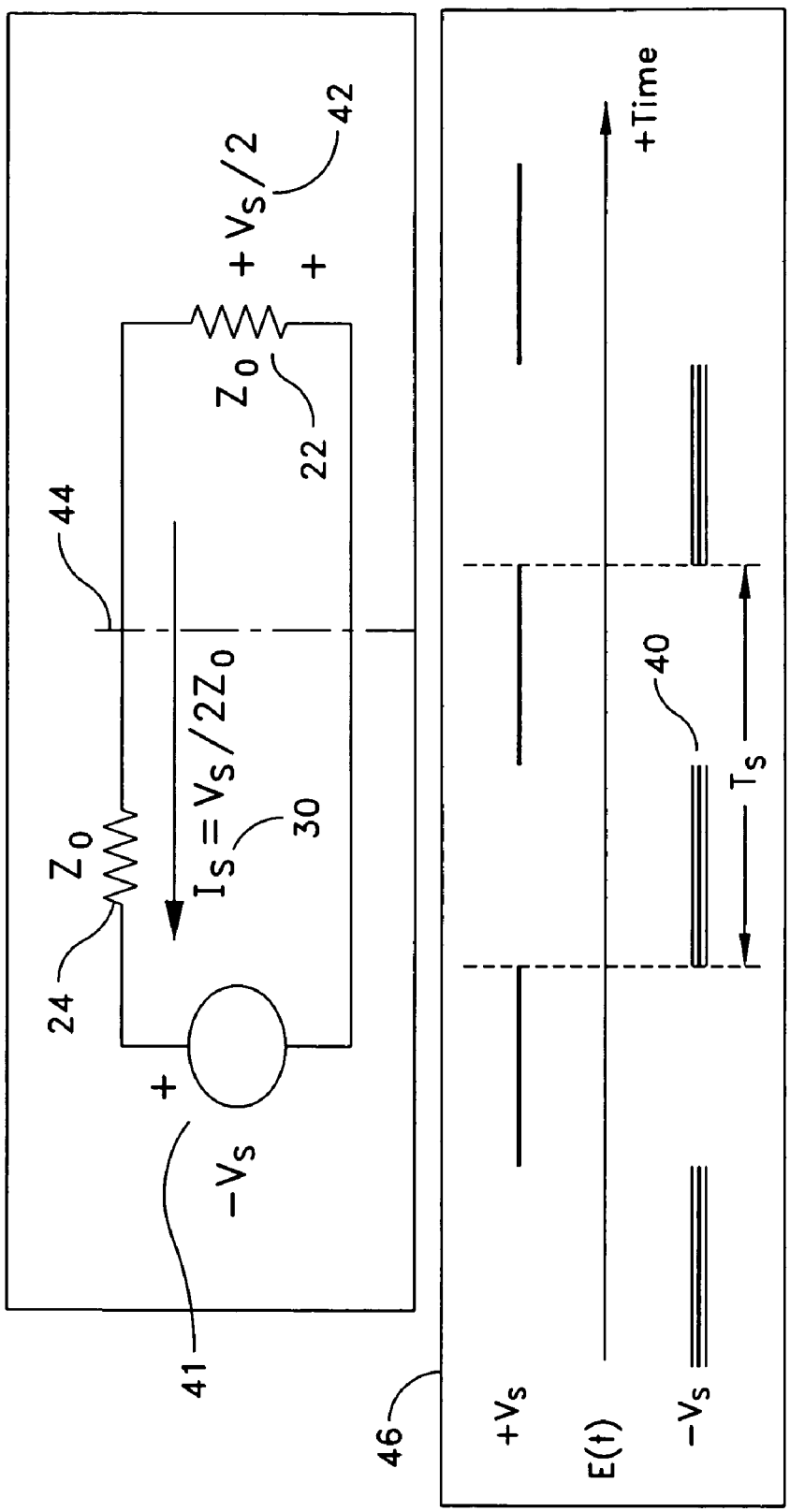
FIG. 4 depicts a square-wave source, negative half period.

During a negative state of the generator, illustrated in FIG. 4, the power delivered to the load, $Z_0$ is the same, $(V_S)^2/4Z_0$, even though the current 30 flows in the opposite direction. During a negative half period 40 of the square-wave cycle, the current 30 is positive and equal to a peak voltage $-V_S$ (41), divided by the total circuit resistance $2Z_0$ and a voltage 42 across the load is one half of the peak voltage. Thus, the average power is equal to the instantaneous power and is defined as $P_{MAX}=(V_S)^2/4Z_0$, which is the maximum power available from the source. Thus terminated, the generator 20 is optimally loaded because the generator is delivering a maximum available power to the load, $Z_0$.

Energy Efficient Square-Wave Generator

The disclosed method uses inductors and capacitors as energy storage elements and it is well known to those ordinarily skilled in the art that energy is lost when an abrupt change in capacitor voltage or an abrupt change in inductor current is required by circuit operation. Under steady state operating conditions within the disclosed circuits, inductor current and capacitor voltage remain essentially constant.

"Steady state" operating conditions are the operating conditions under which the circuits would normally be used.

When the circuits of the disclosed method are first energized and the switch begins operation, the current through the inductor and the voltage across the capacitor are both zero. A transient state exists until the current of the inductor and the voltage of the capacitor have become periodically stable.

The operating conditions are described as steady state. However, inductor voltage and capacitor current are each subjected to abrupt changes as the square-wave polarity changes. Even though these abrupt changes are allowable with ideal components, the parasitic capacitance of the inductors and the parasitic inductance of the capacitors will degrade the ideal operation of the method and decrease the observed efficiency. These parasitic effects are not further addressed in this disclosure because, in good engineering practice, these effects will only minimally degrade performance.

Figure 5:
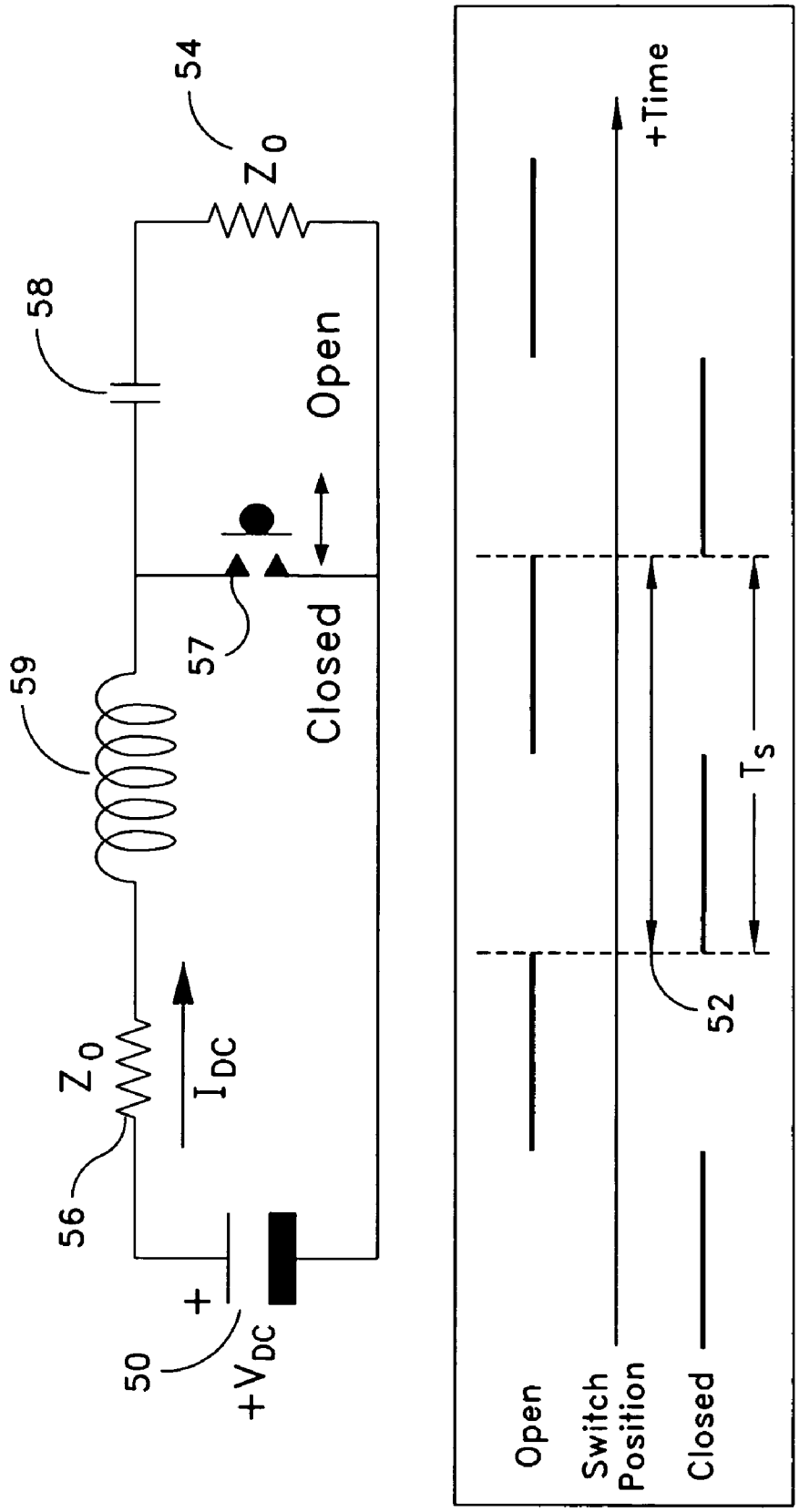
FIG. 5 depicts a square-wave generator.

The circuit illustrated in FIG. 5 is used to convert a DC source 50 into a square-wave 52 driving a load impedance 54 which is equal to an internal impedance 56 of the DC source. Assuming ideal components, the efficiency of the conversion is approximately one hundred percent because the average square-wave power delivered to the load impedance 54 is approximately equal to the maximum DC power available from the DC source 50.

A square-wave is created by the periodic operation of a switch 57 that changes state once each period, $T_S$, of the square-wave. The switch 57 opens and closes periodically causing a square-wave of current to pass through the load impedance 54. A transient state occurs when the switch action is first initialized. The transient state lasts until the voltage across a capacitor 58 and the current through an inductor 59 each reach a steady state condition.

The two states of the switch 57 are defined as follows: (1) when the switch is OPEN, the current through the branch containing the switch is zero while the voltage across the branch may assume any value and (2) when the switch is CLOSED, the voltage across the branch containing the switch is zero while the current through the branch may assume any value. The dwell time in each of the two switch states is the same.

Figure 6:
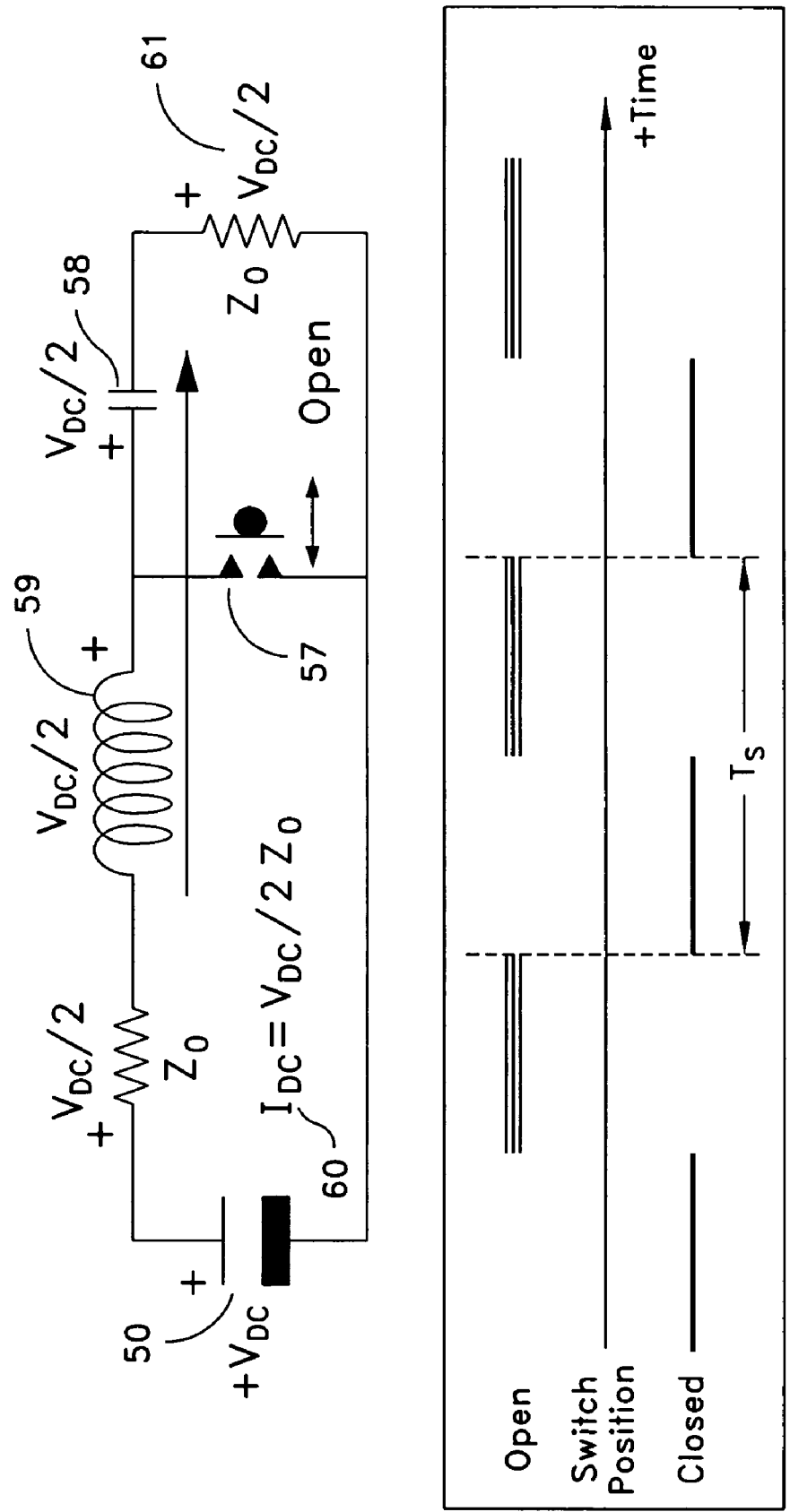
FIG. 6 depicts a square-wave generator, steady state, with switch in OPEN position.

A steady-state switch OPEN condition is illustrated in FIG. 6. During this half period, the switch 57 is OPEN so that the current through a branch of the switch is zero. A steady state current 60 equal to $V_{DC}/2Z_0$ passes through the load $Z_0$, producing a voltage 61. During this half period, energy is supplied to the circuit by the inductor 59 while energy is being stored in the capacitor 58. The voltage across the OPEN switch 57 is $V_{DC}$.

The average, steady state, energy stored on the inductor 59 is $E_{AVG}=[L\,(V_{DC})^2]/8\,(Z_0)^2$ in which "L" is the inductance of the inductor. The energy delivered to the circuit by the inductor 59 during each OPEN condition half period is $E_{DEL}=T_S(V_{DC})^2/8Z_0$.

The choice of value of the inductor 59 is made by observing that the delivered energy, $E_{DEL}$, should be a fraction of the average energy, $E_{AVG}$. This will be true if the inductance is much greater than the product $Z_0T_S$. Thus, $L>>Z_0T_S$ is required. During the OPEN condition of the switch 57, the voltage across the branch of the switch is $V_{DC}$.

Figure 7:
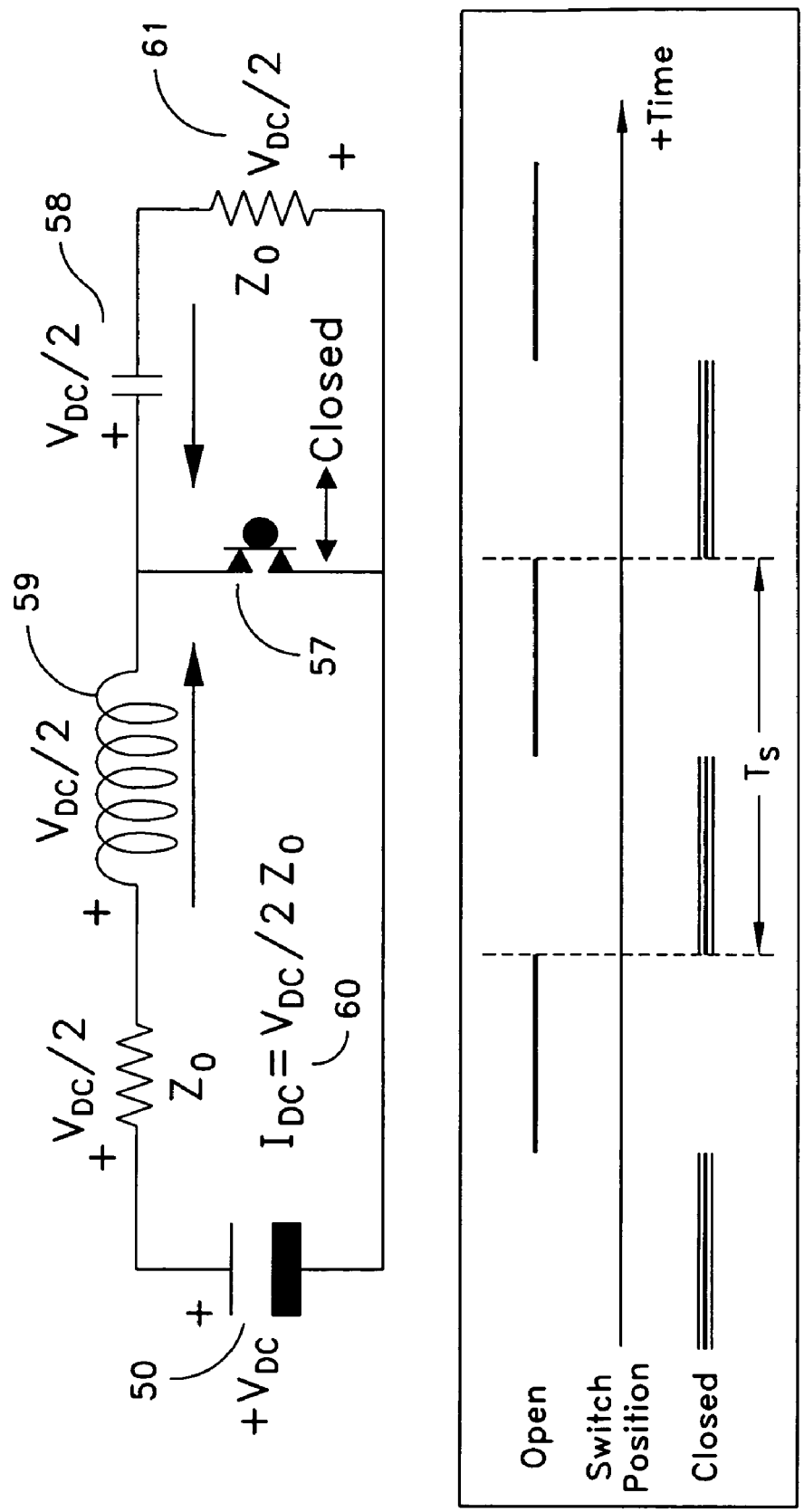
FIG. 7 depicts a square-wave generator, steady state, with switch in CLOSED position.

A steady state CLOSED condition of the switch 57 is illustrated in FIG. 7. During this half period, the switch 57 is CLOSED so that the voltage across the branch of the switch is zero. The steady state current 60 equal to $V_{DC}/2Z_0$ reverses through the load, $Z_0$, producing the voltage $-V_{DC}/2$ (61). During this half period, $T_S/2$, energy is delivered to the circuit by the capacitor 58 while stored energy of the inductor 59 is increasing.

The average, steady state energy stored on the capacitor 58 is $E_{AVG}=C(V_{DC})^2/8$ in which "C" is the capacitance of the capacitor. The energy delivered to the circuit by the capacitor 58 during each CLOSED condition half period is $E_{DEL}=T_S(V_{DC})^2/8Z_0$, which is the same as the energy delivered by the inductor 59 during each OPEN condition half period. The choice of value of the capacitor 58 is made by observing that the delivered energy, $E_{DEL}$, should be a fraction of the average energy, $E_{AVG}$. This will be true if the capacitance is much greater than the ratio $T_S/Z_0$. Thus, $C>>T_S/Z_0$ is required. During the CLOSED condition of the switch 57, the current through a branch of the switch is $V_{DC}/Z_0$, which is twice the current from the DC source 50.

Figure 8:
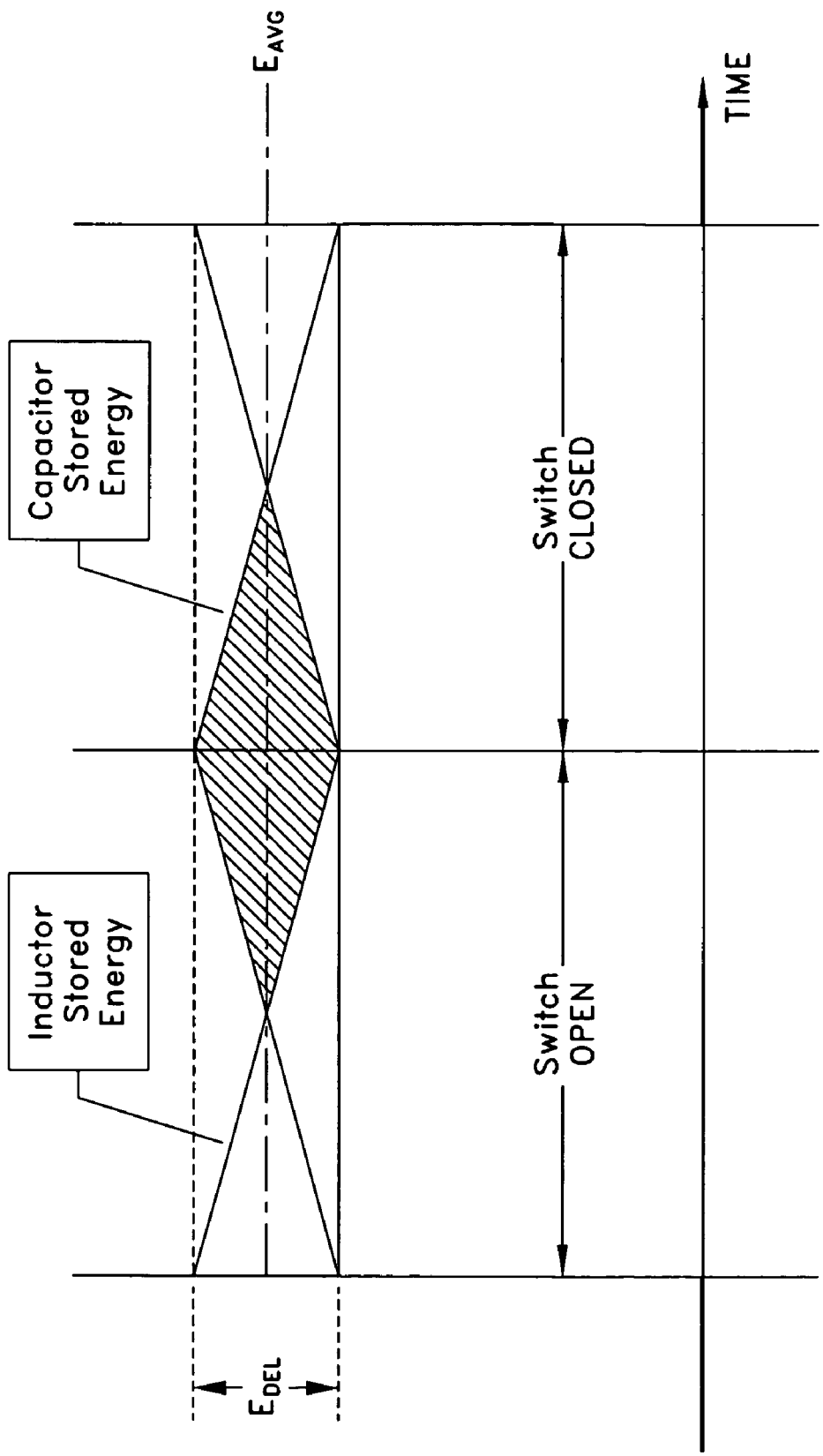
FIG. 8 depicts a square-wave generator, steady state energy exchange.

Energy balance is achieved if the ratio of the element values, L and C, are chosen such that $(L/C)=(Z_0)^2$. The average energy stored on each element is the same. The energy exchange during each period of steady state operation is illustrated in FIG. 8. The graph of the figure depicts the time variation of the energy stored on the inductor 59 and the capacitor 58 in the square-wave generator, as illustrated in FIG. 5, FIG. 6 and FIG. 7. During each half period, energy is delivered to the circuit by either the capacitor 58 or the inductor 59 while the energy stored on the other component is increasing. During the next half period, the process reverses. The graph is based on an assumed condition that $E_{DEL}<<E_{AVG}$. Only one period is illustrated because, in the steady state, each period is identical to every other period.

By comparing FIG. 6 with FIG. 7, the effects caused by the CLOSING operation of the switch 57 are shown. The instant that the switch 57 closes, the voltage across the inductor 59 changes polarity, but not magnitude, while the current 60 through the capacitor 58 and the load impedance changes direction, but not magnitude. Both of these instantaneous changes are permissible by the boundary conditions imposed by the circuit components and no transient behavior occurs as a result of the CLOSING operation of the switch 57. The current through the inductor 59 and the voltage across the capacitor 58 do not change when the switch 57 CLOSES and this is required by the respective boundary conditions of the capacitor and the inductor.

A switch used to implement the square-wave generator circuit may be a transistor collector-emitter circuit. A small amount of energy would be necessary to power a switch driver to provide the base-emitter drive current, which may be more than one hundred times less than the peak collector-emitter current, $V_{DC}/Z_0$, when the switch is CLOSED.

Energy Efficient [Square-Wave]-to-DC Converter.

Figure 9:
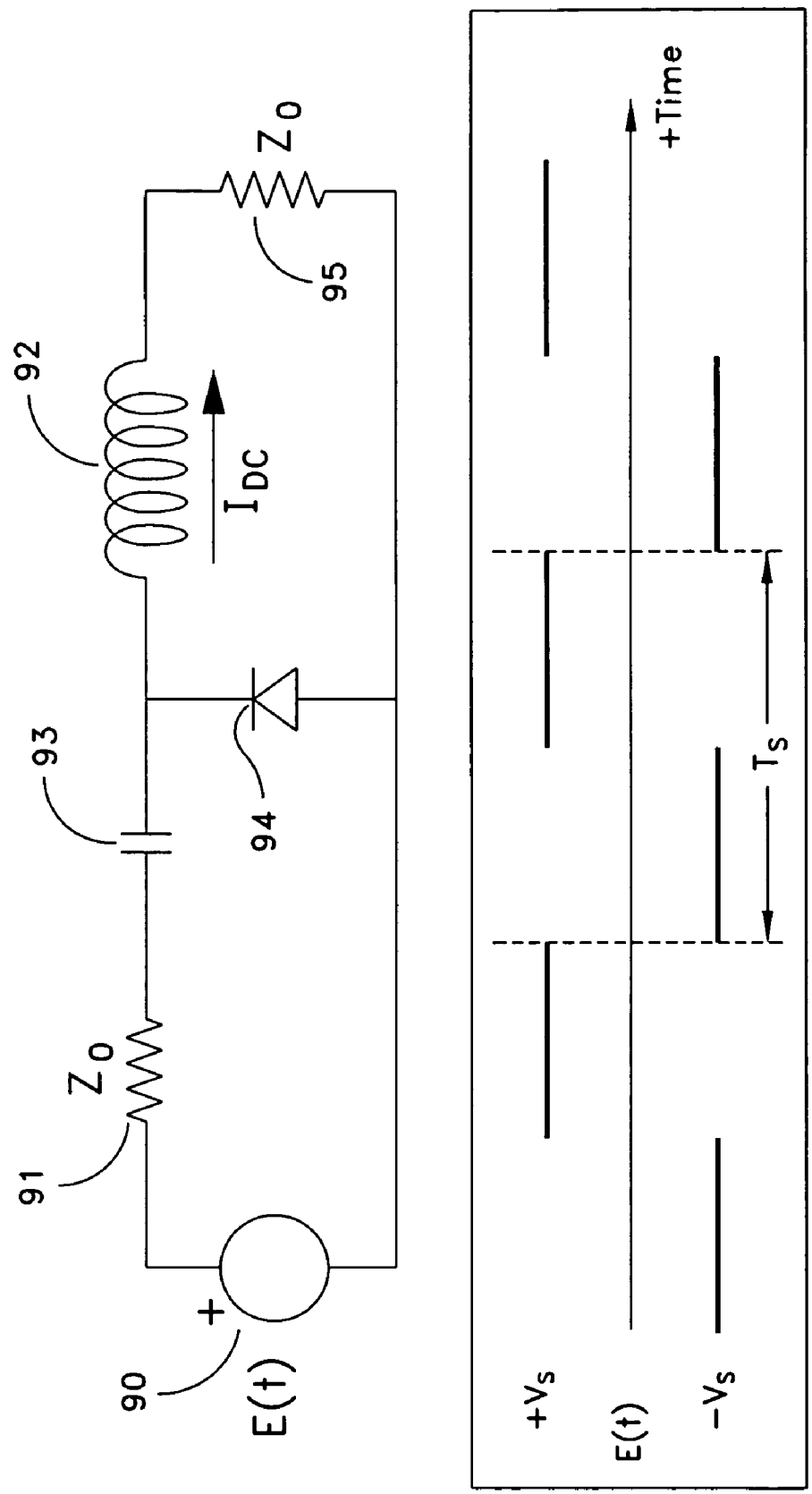
FIG. 9 depicts a [square-wave]-to-DC converter circuit.

In FIG. 9, a [square-wave]-to-DC converter circuit is shown. The passive circuit of the figure requires a capacitor and an inductor for energy exchange. A square-wave source 90 and a source impedance 91 represent the Thevenin-Equivalent generator, as previously described in the "Introduction to the Disclosed Method" section, of a transmission line being driven by a square-wave generator, as described in the "Energy Efficient Square-Wave Generator" section. If an inductor 92, a capacitor 93, and a diode 94 of the converter circuit are assumed to be ideal, then the efficiency of the converter circuit is one hundred percent. That is, the DC power delivered to a load resistor 95 is equal to the maximum power available from the Thevenin-Equivalent generator.

The square-wave source 90 periodically switches between a positive voltage, $V_S$, and a negative voltage, $-V_S$. After a steady state condition is reached, the inductor 92 acts as a current source delivering a positive current to the load resistor 95. A transient state occurs when the square-wave source is first initialized. The transient state lasts until the voltage across the capacitor 93 and the current through the inductor 92 each reach a steady state condition.

The square-wave is converted to direct current by a non-linear property of the diode 94 that, in one state, permits an undefined current to flow through the diode branch in only one direction while the voltage across the branch containing the diode is zero and that, in a second state, permits an undefined voltage across the diode branch in only one polarity while the current through the branch is zero. The operation of the converter circuit in a steady state is described by observing each non-linear state separately. When the polarity of the diode 94 is as illustrated in the figure, the two states correspond to the NEGATIVE half period of the square-wave and to the POSITIVE half period of the square-wave, respectively.

Figure 10:
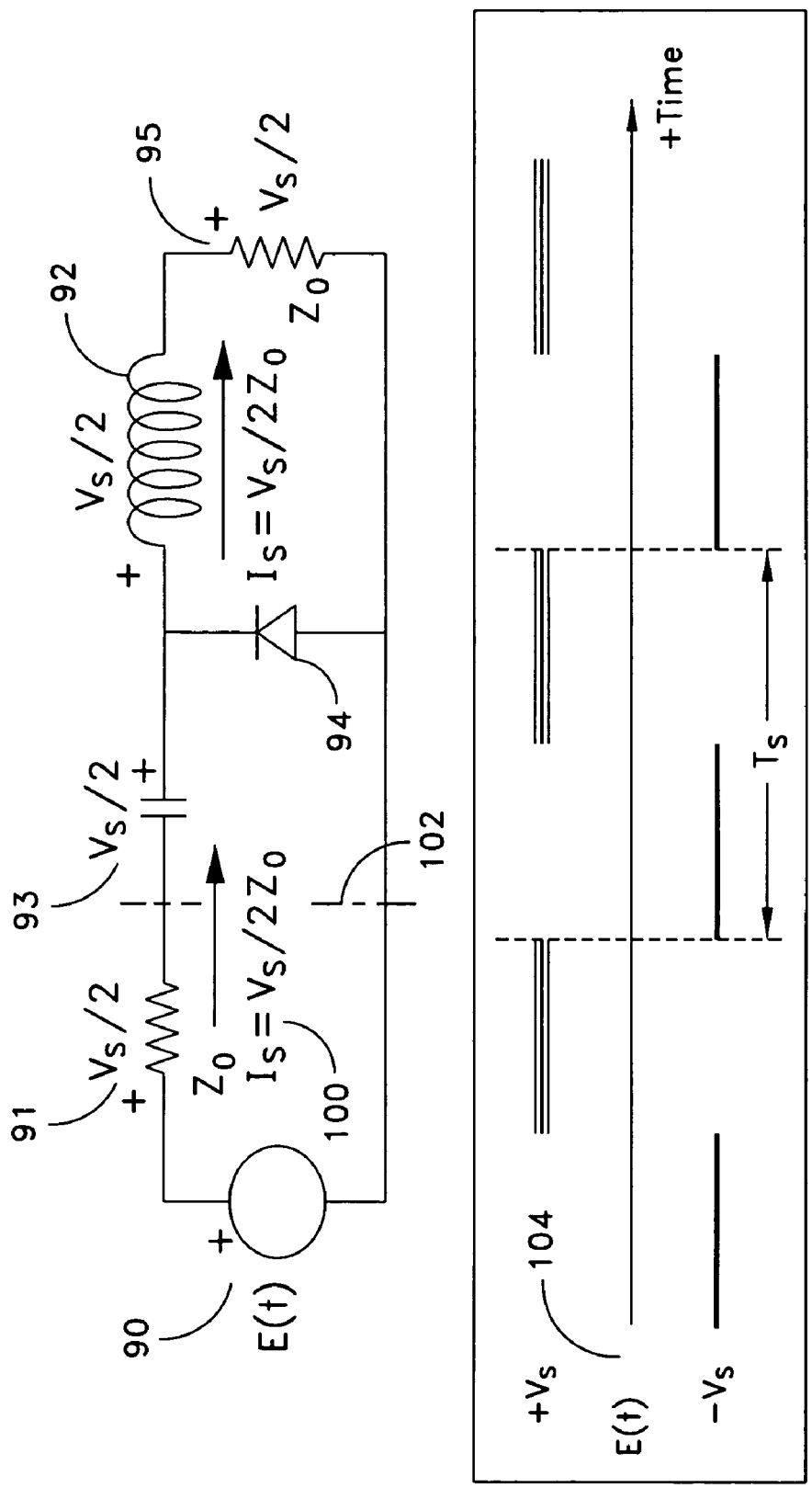
FIG. 10 depicts a [square-wave]-to-DC converter, POSITIVE half period, diode not conducting.

The steady state operation of the converter circuit during the POSITIVE half period is illustrated in FIG. 10. The current through a branch of the diode 94 is zero. Thus, a current 100 driven by the square-wave source 90 flows through the capacitor 93, the inductor 92, and the load resistor 95. During the POSITIVE half period, energy is delivered to the circuit by the capacitor 93 while stored energy of the inductor 92 is increasing. The average, steady state, energy stored on the capacitor 93 is $E_{AVG}=C(V_S)^2/8$. The energy delivered to the circuit by the capacitor during each POSITIVE half period is $E_{DEL}=T_S(V_S)^2/8Z_0$. The choice of the value of the capacitor 93 is made by observing that the delivered energy, $E_{DEL}$, should be a fraction of the average energy, $E_{AVG}$. This is true if the capacitance is greater than the ratio $T_S/Z_0$. Thus, $C>>T_S/Z_0$ is required. During the POSITIVE half period of the square-wave, the voltage across the diode branch is $V_S$ with a polarity that reverse-biases the diode junction so that no current can flow in the branch containing the diode.

During the POSITIVE half period, the square-wave source 90 presents a positive voltage, $V_S$, to the circuit causing a current $V_S/2Z_0$ to flow in the circuit. The diode 94 is reverse-biased by a voltage equal to $V_S$ so that no current flows in the branch containing the diode. Thus, the current, $I_S$, flows through the load, $Z_0$, generating a voltage $V_S/2$ across the load. During this half period, the capacitor 93 supplies energy to the circuit while the inductor 92 is storing energy.

Figure 11:
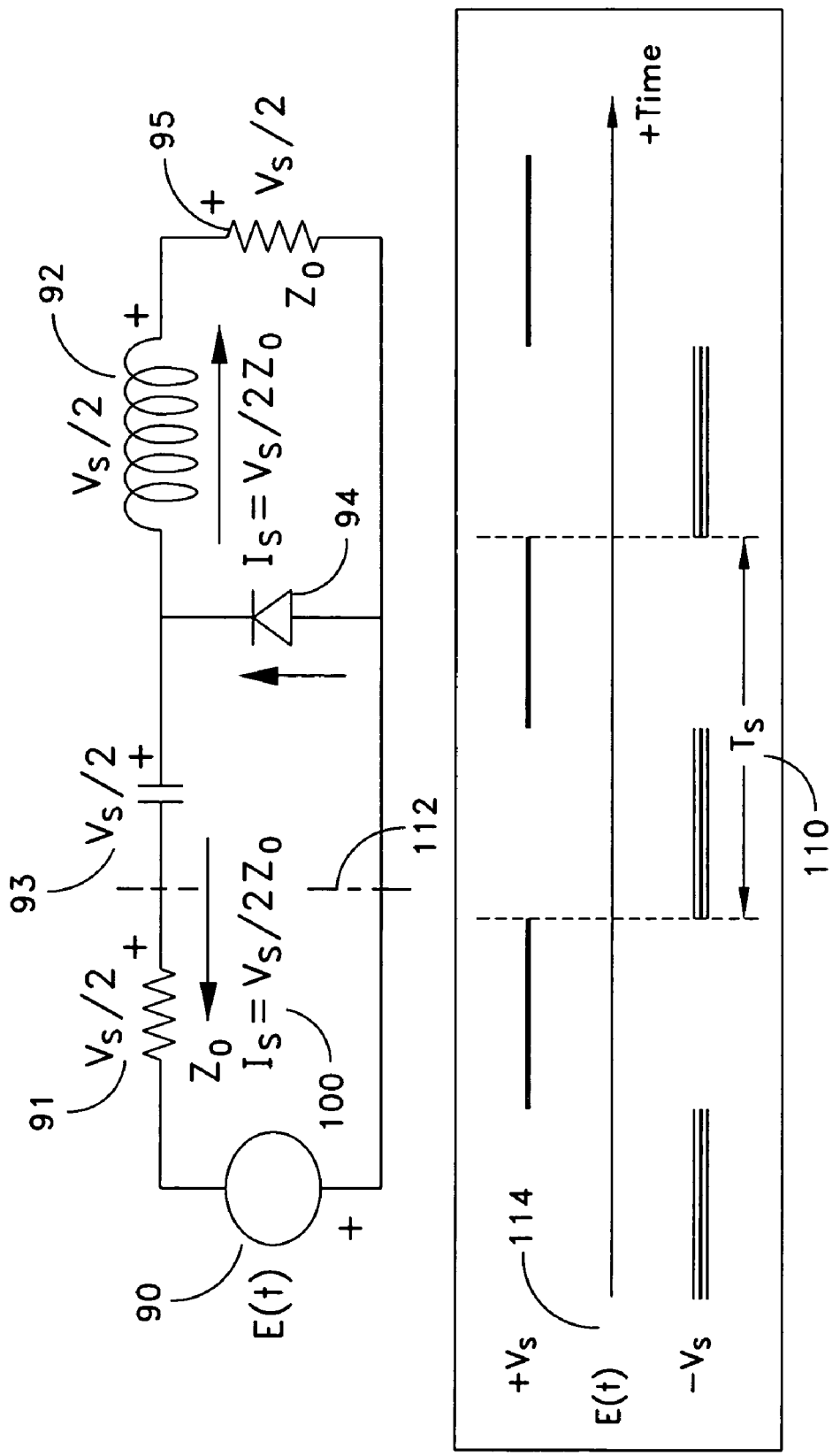
FIG. 11 depicts a [square-wave]-to-DC converter, NEGATIVE half period, diode not conducting.

The steady state operation of the converter circuit during a NEGATIVE half period 110 is illustrated in FIG. 11. The voltage across the branch of the diode 94 is zero and the current through the branch is $V_S/Z_0$, which is twice the current 100 driven by the square-wave source 90. During this half period $T_S/2$, energy is delivered to the circuit by the inductor 92 while stored energy of the capacitor 93 is increasing. The average, steady state, energy stored on the inductor 92 is $E_{AVG}=[L(V_S)^2]/8(Z_0)^2$. The energy delivered to the circuit by the inductor 92 during each NEGATIVE half period is $E_{DEL}=T_S(V_S)^2/8Z_0$. The choice of value of the inductor 92 is made by observing that the delivered energy, $E_{DEL}$, should be a fraction of the average energy, $E_{AVG}$. This will be true if the inductance is much greater than the product $Z_0T_S$. Thus, $L>>Z_0T_S$ is required.

During the NEGATIVE half period, the square-wave source 90 presents a negative voltage, $V_S$, to the circuit causing a current $-V_S/2Z_0$ to flow in the circuit. The diode 94 is forward-biased by a current equal to $V_S/Z_0$ and the voltage across the branch containing the diode is about zero. A current, $I_S$, flows through the load, $Z_0$, generating a voltage $V_S/2$ across the load. During this half period, the capacitor 93 is storing energy while the inductor 92 supplies energy to the circuit.

Figure 12:
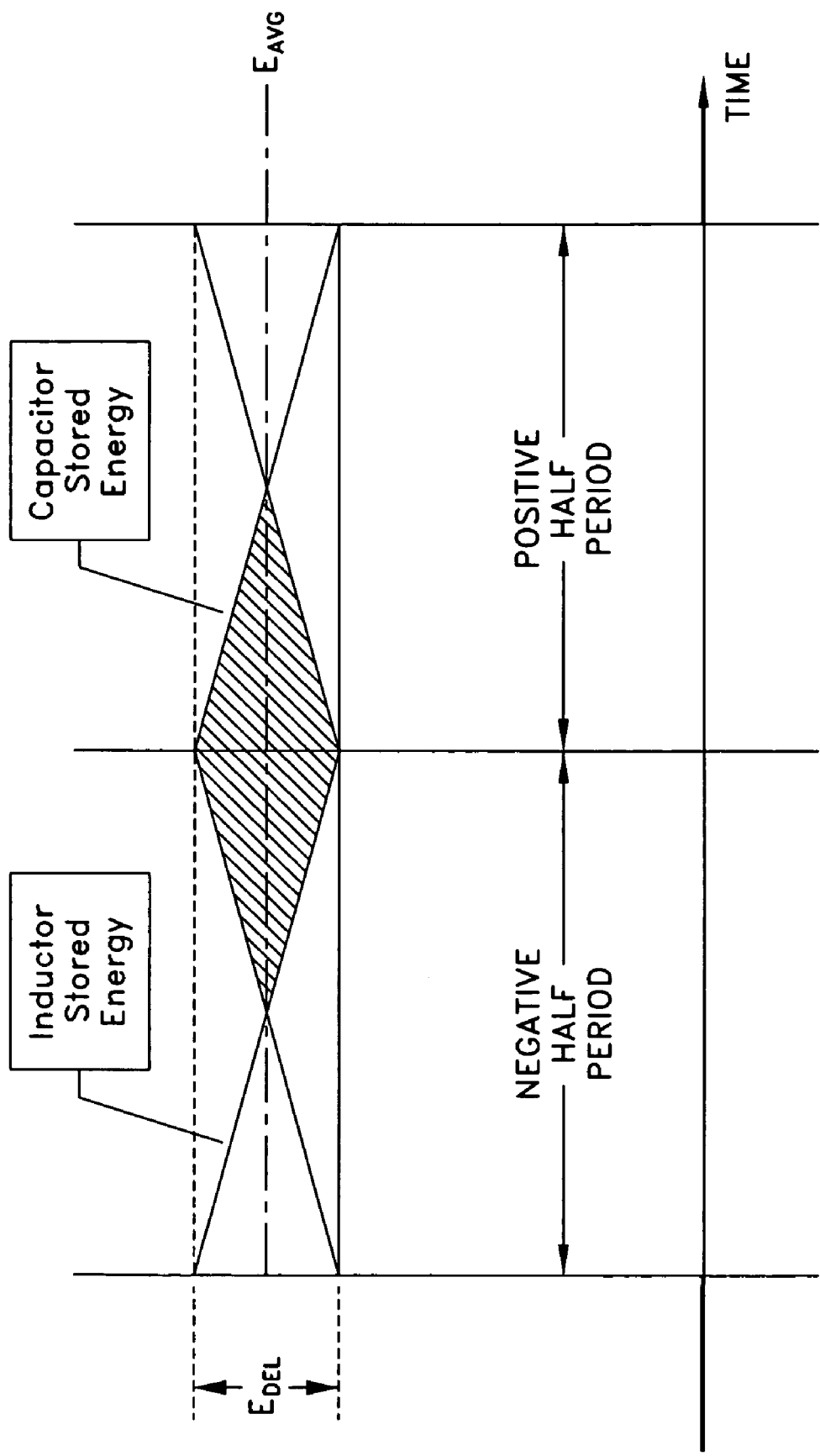
FIG. 12 depicts a steady state energy exchange.

Energy balance is achieved if the ratio of the element values, L and C, are chosen such that $(L/C)=(Z_0)^2$. The average energy stored on each element is the same. The energy exchange during each period of steady state operation is illustrated in FIG. 12. The graph of the figure depicts the time variation of the energy stored on the inductor 92 and capacitor 93 in the DC converter illustrated in FIG. 9, FIG. 10 and FIG. 11. During each half period, energy is delivered to the circuit by either the inductor 92 or the capacitor 93 while the energy stored on the other component is increasing. During the next half period, the process reverses. The graph is based on an assumed condition that $E_{DEL}<<E_{AVG}$. One half period is illustrated because, in the steady state, each period is identical.

By comparing FIG. 10 with FIG. 11, the effects caused by the instantaneous change in square-wave polarity from POSITIVE to NEGATIVE are shown. The instant that the square-wave polarity changes, the voltage across the inductor 92 changes polarity, but not magnitude, while the current through the capacitor 93 changes direction, but not magnitude. Both of these changes are permissible by the boundary conditions imposed by the circuit components and no transient behavior occurs as a result of the polarity change. The current through the inductor 92 and the voltage across the capacitor 93 do not change when the square-wave polarity changes and this is required by the respective boundary conditions of the inductor and the capacitor. The current through the load resistor 95 is the same as the current through the inductor 92 and does not change in either polarity or magnitude. Thus, the load resistor 95 experiences Direct Current as predicted.

By comparing FIG. 10 with FIG. 3 and FIG. 11 with FIG. 4, the converter circuit, illustrated in FIG. 9, is indistinguishable from a circuit with a resistive termination, $Z_0$. Consider a boundary 102 shown in FIG. 10 and a boundary 34 shown in FIG. 3.

The Thevenin-Equivalent circuit to the left of the boundary 102 in FIG. 10 is identical to the Thevenin-Equivalent circuit to the left of a boundary 34 in FIG. 3.

The current 100 crossing a boundary 102, from the Thevenin-Equivalent generator to the converter circuit is identical to the current 30 crossing the boundary 34 from the Thevenin-Equivalent generator to the matched termination $Z_0$ at the load resistor 22.

The voltage across the boundary 102 is $V_S/2$, which is identical to the voltage across the boundary 34.

Thus, during the POSITIVE half cycle of a square-wave 104, 36, the converter circuit is indistinguishable from a resistor having a value $Z_0$.

Consider a boundary 112 shown in FIG. 11 and a boundary 44 shown in FIG. 4.

The Thevenin-Equivalent circuit to the left of the boundary 112 in FIG. 11 is identical to the Thevenin-Equivalent circuit to the left of the boundary 44 in FIG. 4.

The current 100 crossing the boundary 112, from the converter circuit to the Thevenin-Equivalent generator is identical to the current 30 crossing the boundary 44 from the matched termination, $Z_0$, to the Thevenin-Equivalent generator.

The voltage across the boundary 112 is $-V_S/2$, which is identical to the voltage across the boundary 44.

Thus, during a NEGATIVE half cycle of a square-wave 114, 46, the converter circuit is indistinguishable from a resistor having a value $Z_0$.

Figure 13:
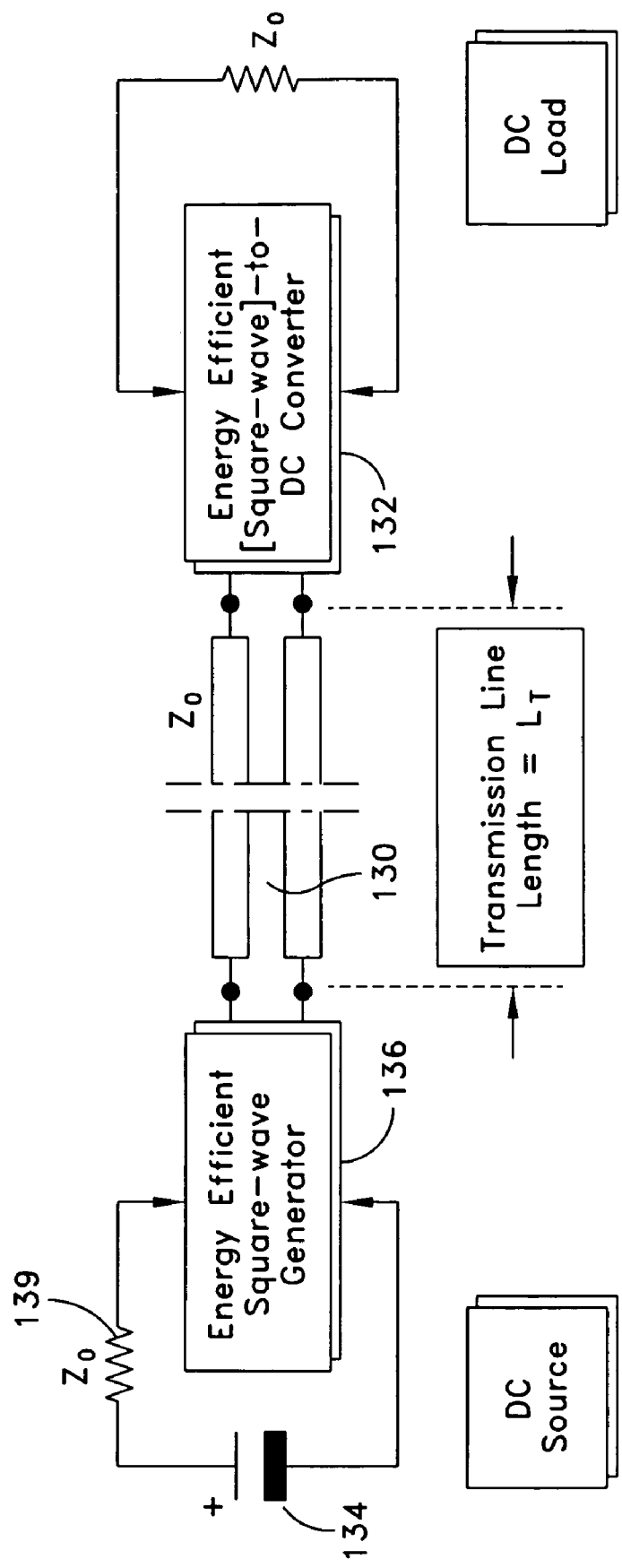
FIG. 13 depicts a typical power transmission model.

After reaching a steady state condition, the disclosed converter circuit of FIG. 9, is indistinguishable from a resistive termination, $Z_0$, when driven by a square-wave. This property allows the converter circuit to be used as a matched termination for a uniform transmission line of any length with a transmission line characteristic impedance equal to $Z_0$ when the transmission line is driven by a square-wave source. This property is illustrated in FIG. 13.

In the figure, a transmission line 130 may be comparatively long since a converter 132 presents a matched termination to the transmission line. The matched termination insures that there are no reflections or standing waves on the line that would corrupt the operation of the system.

Power from a DC source 134 is transmitted over a distance $L_T$ using an energy efficient square-wave generator 136 and the energy efficient [square-wave]-to-DC converter 132. A source impedance 139 of the generator, the characteristic impedance of the transmission line 130 and the DC load impedance are each equal to $Z_0$.

Figure 14:
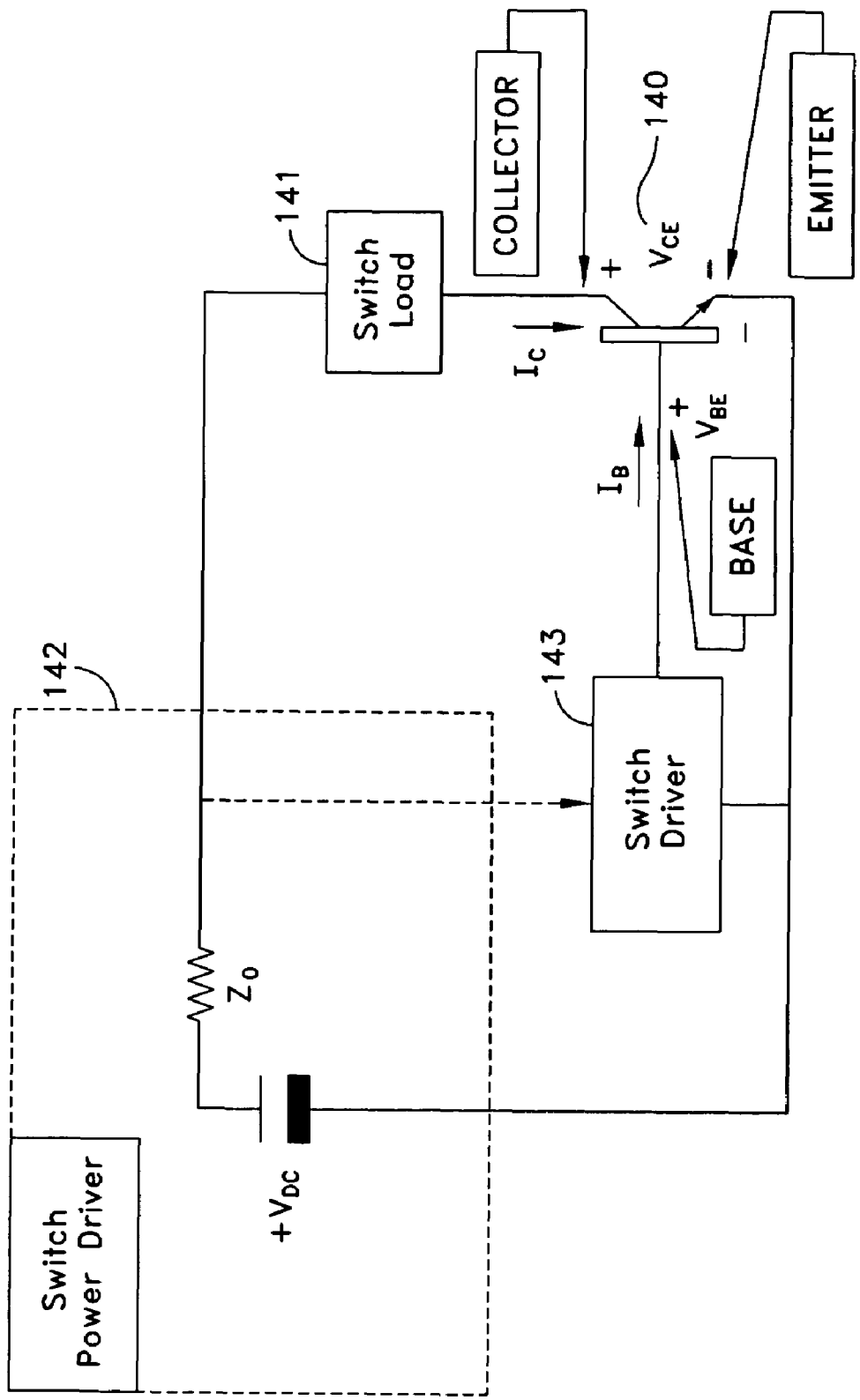
FIG. 14 depicts a transistor shunt-switch modulator system.

In FIG. 14, a NPN transistor 140 is provided that switches between an OPEN circuit and a SHORT circuit to modulate the current through a switch load 141. A Thevenin-Equivalent power supply 142 represents the power source that supplies the load current to the load when the transistor is switched ON by a circuit of a switch driver 143. Power from the DC source is switched from the load 141 by the action of the transistor 140. The switch driver 143 causes the transistor 140 to periodically switch from a conducting state(CLOSED state) to a non-conducting state (OPEN state).

This disclosure focuses on a design for the switch driver 143 and is based on the fact that the NPN-transistor based-emitter-junction operating characteristics can be represented by a PN-junction diode. Furthermore, the maximum load current, which is the collector current ($I_c$) of the transistor, is BETA-times the base current ($I_B$) which is provided by the switch driver 143. Thus, the design of the switch driver 143 comprises a circuit that is capable of delivering a controlled forward base current to switch the transistor ON (CLOSED switch) and a controlled reverse base-emitter bias to turn the transistor OFF (OPEN switch) without exceeding the reverse breakdown of the base-emitter junction.

A Method for Accurately and Efficiently Driving an NPN-Transistor Used as a Periodic Switch in a Common-Emitter Application.

Other embodiments of the switching method extend to switches that use PNP transistors and/or appear in common-collector, common-base, and/or floating applications. Other bi-mode switching devices can be used with the disclosed driver-design method. For example, any device that requires a precisely controlled current in one mode and a precisely controlled voltage in a second mode, as is the case with a PN-junction diode that is switched between a precisely controlled forward current, which defines an ON mode, and a precisely controlled reverse-bias voltage, which defines an OFF mode.

Figure 15:
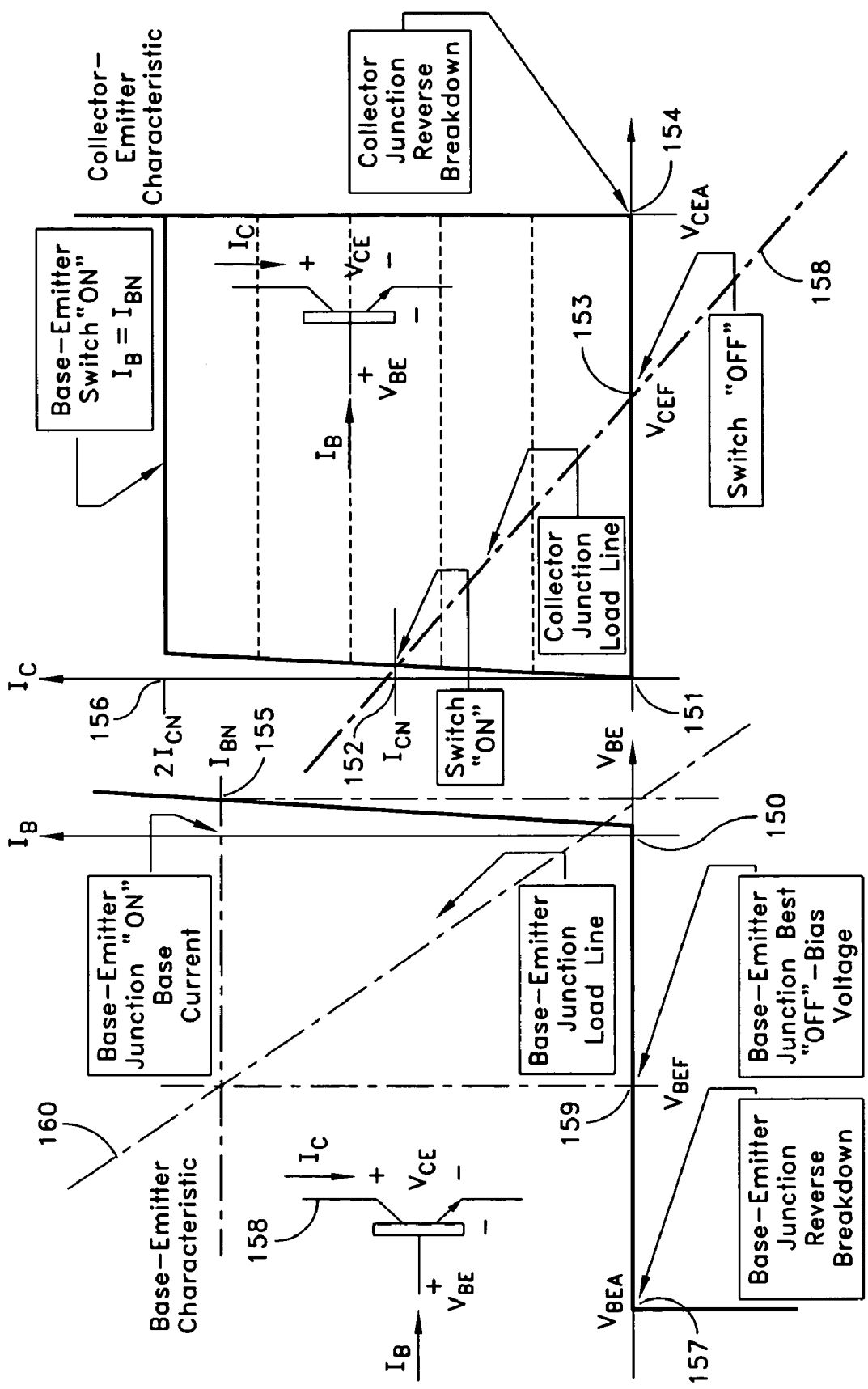
FIG. 15 depicts switching NPN-transistor junction characteristics.

In FIG. 15, the properties that characterize the behavior of a typical NPN transistor are illustrated. In a graphic 150 on the left, the terminal relationship between the transistor base current, $I_B$, and the transistor base-emitter voltage, $V_{BE}$ is illustrated. When the junction is forward-biased, base current, $I_B$, flows from the base to the emitter and the base-emitter voltage, $V_{BE}$, is usually smaller than 0.6 volts.

When the junction is reverse-biased, the base-emitter current is typically less than a few (negative) micro-amperes until the reverse-bias voltage reaches the junction avalanche voltage, $V_{BEA}$. If the avalanche voltage were exceeded, then the current may quickly become comparatively large and the junction may self-destruct, thereby destroying the transistor. This is a common cause of failure in power transistors used as high-frequency periodic switches.

In a graphic 151 on the right side of FIG. 15, the collector-emitter characteristics of a typical NPN transistor are illustrated. The relationship between the collector-emitter current, $I_C$, and the collector-emitter voltage, $V_{CE}$, is illustrated. When used as an amplifier, the transistor is biased so that operation takes place in a region where the collector-emitter current is virtually independent of the collector-emitter voltage. When used as a switch, the transistor is biased so that, in an ON-state and conducting state 152, the collector-emitter voltage is approximately zero and is almost independent of the collector current and, in an OFF-state and non-conducting state 153, the collector current is nearly equal to zero while the collector-emitter voltage can range from small positive values to the collector avalanche breakdown voltage, $V_{CEA}$(154)—"CEA" is Collector-Emitter-Avalanche and is the value of the collector to emitter voltage at which avalanche occurs. Avalanche is an unstable condition in which the current increases as a result of a multiplicative process and can destroy the component. If the collector avalanche breakdown voltage is exceeded, the transistor may self-destruct.

The ON-state collector characteristic is determined by base-current magnitude, which is established by the switch driver. In the figure, the ON-state base current is $I_{BN}$ (155). Thus, the collector-emitter voltage will remain in saturation until the collector current reaches a value of $2I_{CN}$, which is BETA times the base current $I_{BN}$. In this example, the ON-state base current, $I_{BN}$ (155), is chosen so that the collector junction will remain in saturation until a current 156 that is approximately twice the anticipated maximum switch ON-state, $I_{CN}$ (152), is reached.

In the example, a base-emitter OFF-state reverse-bias is chosen to be approximately one half of an avalanche breakdown voltage, $V_{BEA}$ (157). The corresponding collector-emitter OFF-state voltage operating point, $V_{CEF}$, is chosen to be approximately one half of the collector avalanche breakdown voltage, $V_{CEA}$.

A base-emitter junction load line 158 is determined as the diagonal of a rectangle, which is defined by the ON-state or conducting state base current 155 and an OFF-state or non-conducting state operating point 159. The slope of the load line 158 defines the switch-driver circuit characteristic impedance, $Z_{BE}$, which will be described in connection with FIG. 16.

The collector-emitter load line 158 is defined by the mean ON-state collector current $I_{CN}$ and the mean OFF-state collector-emitter voltage, $V_{CEF}$. The slope of the collector load line 158 defines the collector circuit characteristic impedance, $Z_0$, which will also be described in connection with FIG. 16.

Figure 16:
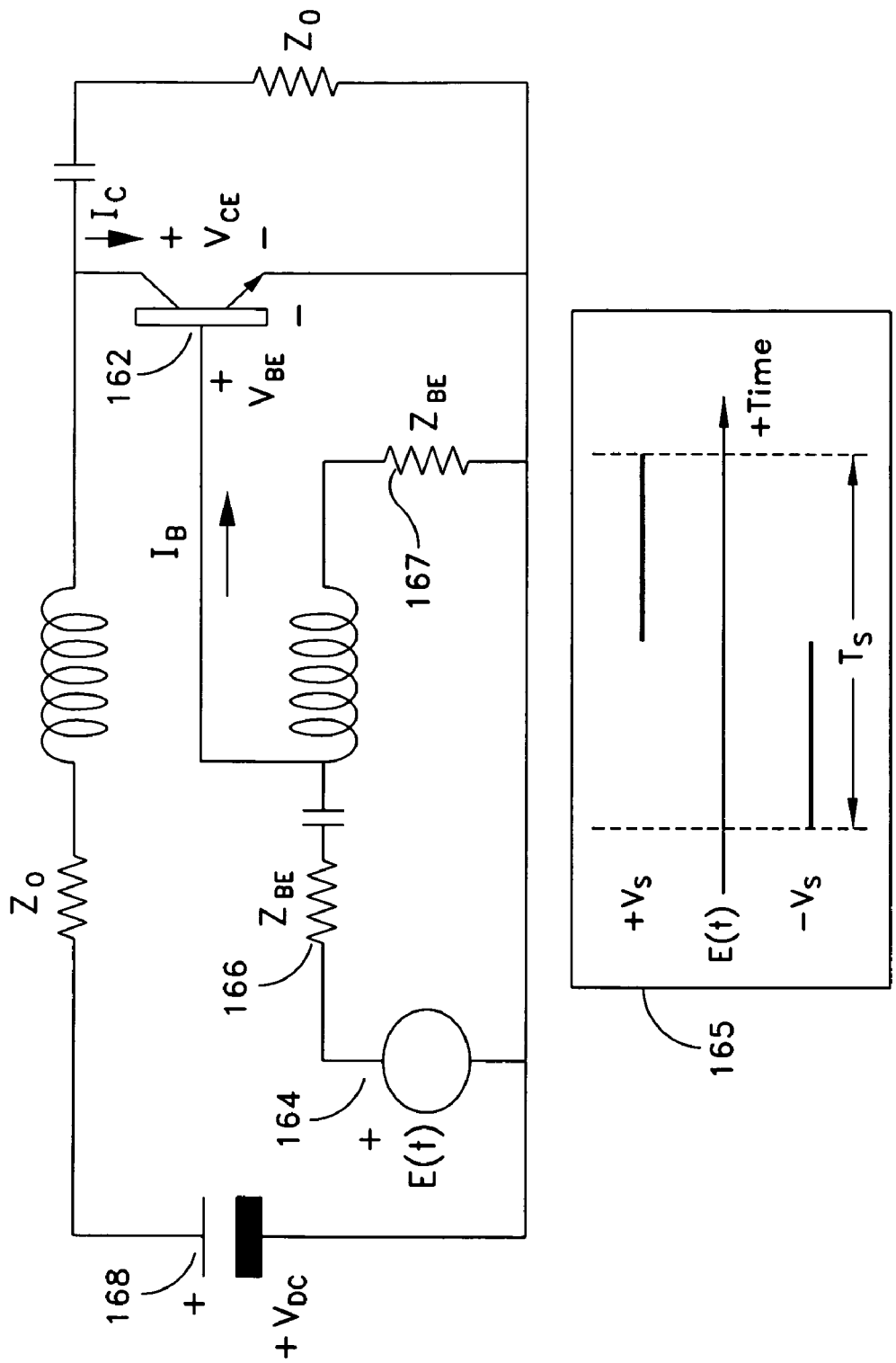
FIG. 16 depicts a switching NPN-transistor circuit used to generate a square-wave source.

In FIG. 16, a basic switch-driver circuit is illustrated. The switch-driver circuit is identical to the energy efficient [square-wave]-to-DC converter previously described in detail in the "Energy Efficient [Square-Wave]-to-DC Converter" section. The role of the diode 94 in the [square-wave]-to-DC converter is taken by the base-emitter junction of the switching transistor in the disclosed switch-driver circuit illustrated in FIG. 16.

A square-wave source 164 switches periodically between a positive voltage, $V_S$, and a negative voltage, $-V_S$, as illustrated in an inset 165. The switching-transistor base-emitter junction bias points can be precisely set by correctly choosing the switch-driver voltage amplitude, $V_S$, and a switch-driver characteristic impedance, $Z_{BE}$ (166, 167). The characteristic impedance is determined from the slope of a base-emitter load line 160 (See FIG. 15) and is $Z_{BE}=V_{BEF}/I_{BN}$. Furthermore, $V_S=I_{BN} \times Z_{BE}$. These conditions establish the specified base-emitter circuit operating conditions that establish the ON or conducting state (CLOSED switch) and OFF or non-conducting state (OPEN switch) of the transistor switch. The power dissipated in the switch-driver circuit is $P_{DSD}=(I_{BN} \times V_{BEF})/4$.

The frequency-domain behavior of the switch-driver circuit is high-pass. The inductor and capacitor are used as energy storage elements, as described in the "Energy Efficient [Square-Wave]-to-DC Converter" section. A low-frequency cutoff at the operating frequency where the square-wave period, $T_S$, is such that $T_S=L/(2Z_0)$ or $T_S=(CZ_0)/2$. If ideal components could be used for all circuit elements, there would be no upper cutoff frequency. In practice, the upper cutoff frequency will be determined by the parasitic elements of the non-ideal circuit components. Also, it is anticipated that the upper cutoff frequency will be several orders of magnitude greater than the lower cutoff frequency. Thus, a multi-octave wide bandwidth switch-driver and switching transistor operation extending from 5 MHz to 500 MHz should be achievable with available components known to those skilled in the art.

An Energy Efficient Amplitude-Phase-Frequency Modulator for Low-Power Wired and Wireless Command, Control, and Communications.

Figure 17:
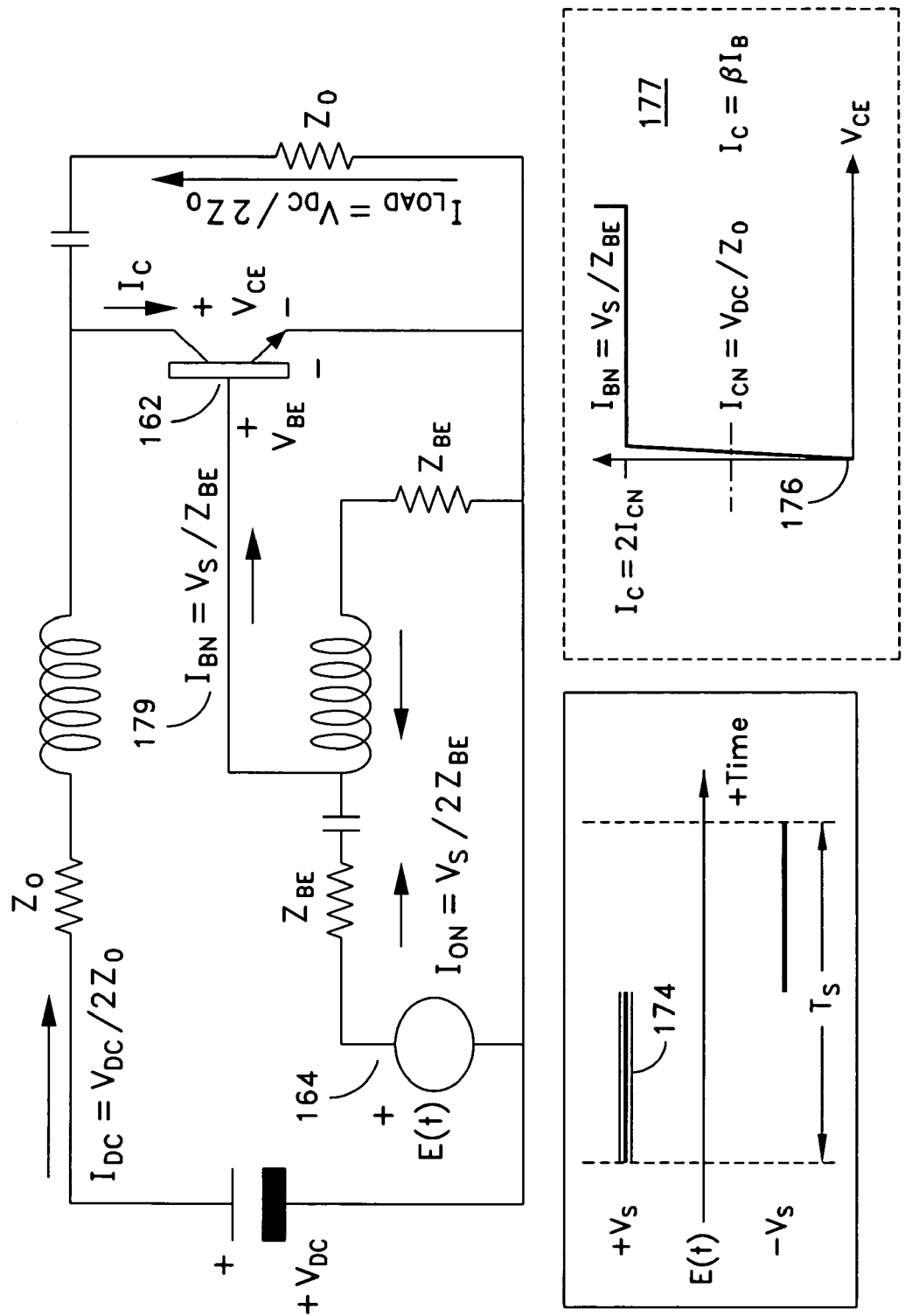
FIG. 17 depicts switching NPN-transistor "ON" state circuit conditions.
Figure 18:
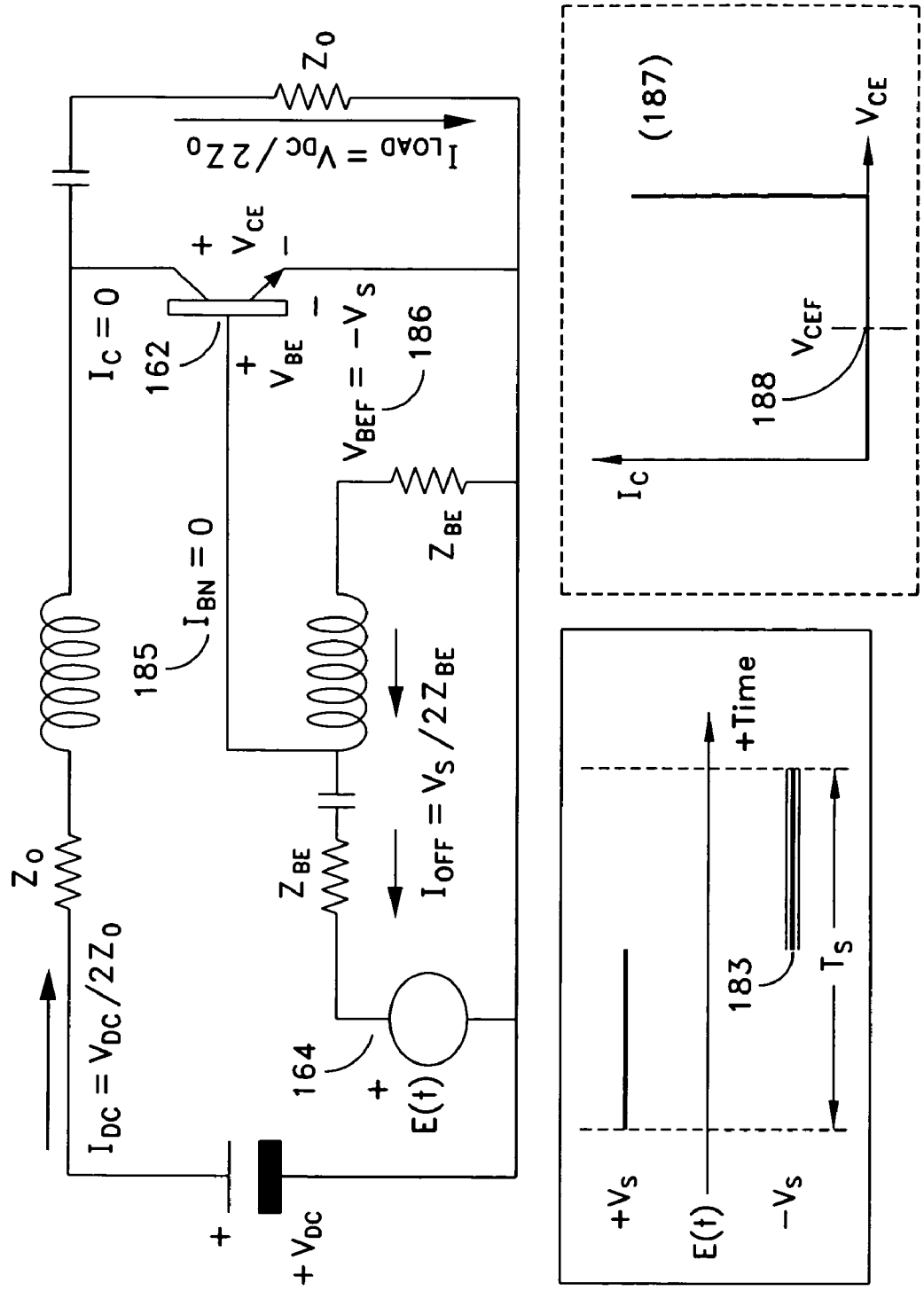
FIG. 18 depicts switching NPN-transistor "OFF" state circuit conditions.

The remaining components in FIG. 16 comprise an energy efficient square-wave generator as previously described, except that the previously described NPN transistor switch 162 replaces the virtual switch 57 illustrated in FIG. 5. Thus, the circuit of FIG. 16 comprises a power modulator that efficiently converts a stable or a slowly varying positive voltage source 168 to a high-frequency square-wave, which is delivered to load impedance, $Z_0$, which may, for example, be an antenna. FIG. 17 and FIG. 18 illustrate two operating states of the modulator.

In FIG. 17, the ON-state of the transistor switch 162, which is effected by a POSITIVE value, $V_S$ (174), of the driver source, E(t) (164) is illustrated. The transistor base current, which is controlled by the driver circuit, is $I_{BN}=V_S/Z_{BE}$ (176), as previously predicted in the section "A Method for Accurately and Efficiently Driving an NPN Transistor Used as a Periodic Switch in a Common-Emitter Application". The transistor collector characteristic, which corresponds to the established transistor base current, is illustrated in an Inset 177. As the collector current increases from zero, the collector-emitter voltage remains in saturation near zero until the collector current reaches a value, $2I_{CN}$, which is β-times the transistor base current, $I_{BN}$ (179). If the transistor collector-emitter voltage, $V_{CE}$, is increased beyond the saturation value, the collector current remains constant at the value determined by the base current until the collector-emitter voltage exceeds the collector-junction avalanche voltage. The design constraints of the disclosed modulator require that the selected switch-transistor collector junction remains in saturation during the ON-state. Thus, the ON-state collector current is bounded by $0 < I_C < \beta I_{BN}$.

If the modulator is used for amplitude modulation, then the modulation will cause the switch-transistor ON-state collector current to vary in proportion to the modulation amplitude. A modulator design constraint that permits maximum peak-to-peak amplitude modulation is to adjust the circuit parameters so that the switch-transistor collector current that corresponds to the average value of the amplitude modulation is one half of the maximum permitted ON-state collector current. Thus, the average ON-state collector current is constrained by $I_{CN}=\beta I_{BN}/2$.

In FIG. 17, the average value of the amplitude modulation is represented by $V_{DC}$. Thus, the choice of modulator characteristic impedance, $Z_0$ is set by the constraint equation $I_{CN}=V_{DC}/Z_0$, which also establishes the switch-transistor collector load line 158 and determines the OFF-state collector emitter voltage, $V_{CEF}$, which is equal to the average value $V_{DC}$.

In FIG. 18, the OFF-state or non-conducting state of the transistor switch 162, which is effected by a NEGATIVE value, $-V_S$ (183), of the driver source, E(t) (164) is illustrated. A switch transistor base current 185 is essentially zero while a base-emitter junction 186 is reverse-biased at a level, $-V_S$. The transistor OFF-state collector characteristic is illustrated in an Inset 187. The collector current remains approximately zero for all values of collector-emitter voltage less than a collector-junction breakdown voltage, $V_{CEA}$. An average OFF-state collector-emitter voltage, $V_{CEF}$, is equal to an average value of an amplitude-modulation voltage, $V_{DC}$.

In an ideal setting, the average OFF-state collector voltage, $V_{CEF}$ (188), would be less than or equal to, one half of the collector-junction breakdown voltage, $V_{CEA}$. However, it may, be possible to optimize the modulator design by choosing an ON-state base current that will simultaneously establish the two conditions (1) $I_{CN}=\beta I_{BN}/2$, and (2) $V_{CEF}=V_{CEA}/2$. Since $I_{CN}=V_{CEF}/Z_0$, these two conditions together require that $I_{BN}=V_{CEA}/(\beta Z_0)$.

Assuming that it is possible to optimize the modulator with respect to modulation voltage and current amplitudes, the resulting switching transistor collector circuit conditions are that the peak-to-peak collector current modulation is equal to the maximum saturation current while the peak-to-peak collector voltage modulation is simultaneously equal to the collector breakdown voltage. This results in a maximum utilization of the switch-transistor dynamic characteristics.

By comparing FIG. 17 and FIG. 18, the switch-driver causes a polarity modulation of the current through the load $Z_0$ and results in a square-wave with frequency and phase determined by the frequency and phase of the switch-driver square-wave and with an amplitude that is determined by the voltage level of the power source, $V_{DC}$. The power delivered to the load, $Z_0$, is $P_{DLOAD}=(V_{DC})^2/4Z_0$, which is approximately equal to the power available from the Thevenin-Equivalent power source comprising the voltage source, $V_{DC}$, and characteristic impedance, $Z_0$.

The power dissipated in the transistor switch is negligible because the saturation voltage in the ON-state is near zero while the collector current in the OFF-state is near zero. However, the overall efficiency of the modulator is degraded by the power dissipated in the switch-driver circuit, which was previously computed in the section "A Method for Accurately and Efficiently Driving an NPN-Transistor Used as a Periodic Switch in a Common-Emitter Application" as $P_{DSD}=(I_{BN} \times V_{BEF})/4$.

If a Modulator Efficiency Factor (MEF) is defined as the ratio of the power dissipated in the driver to the average power delivered to the load, then $MEF=2V_{BEA}/\beta V_{CEA}$. This relationship demonstrates that the optimum modulator circuit efficiency is established by the parasitic parameters of the switch transistor, as would be expected. A typical switching transistor will have Beta=100 and $V_{BEA} < V_{CEA}/10$ so that a typical value of MEF would be less than 0.002, which indicates that the average square-wave power delivered to the modulator load would be more than five hundred times greater than the switch driver power required to generate the square-wave.

It will be understood that many additional changes in details, materials, steps, and arrangements of parts which have been described herein and illustrated in order to explain the nature of the invention, may be made by those skilled in the art within the principle and scope of the invention as expressed in the appended claims.

What is claimed is:

1. A method for increasing the efficiency of a NPN transistor used in periodic switching applications with delivered energy to a load, said method comprising the steps of:
   providing a first power source having characteristic source impedance;
   providing a first circuit having components comprising a first resistor, a first inductor and a first capacitor in series from the first power source to the load;
   providing a second power source in a second circuit in parallel with the first circuit with the second circuit having components comprising a second and third resistor separated by a second capacitor and second inductor;
   providing the NPN transistor as a switch, the transistor grounded and having an electrical connection to the first circuit between the first inductor and the first capacitor with the transistor electrically connected to the second circuit between the second inductor and the second capacitor;
   delivering a controlled base current from the second power source and in the second circuit to switch the transistor to an ON-state;
   delivering a controlled reverse base-emitter bias in the second circuit to switch the transistor to an OFF-state without exceeding a reverse breakdown of the base-emitter junction;
   generating a square-wave voltage by periodic operation of the transistor between the ON-state and the OFF-state by said controlled base current and controlled reverse base-emitter delivering steps;
   achieving a steady state current/voltage condition within the first circuit; and
   delivering energy to the first circuit by the first capacitor and onto the load during a positive half-period of the square-wave resulting from said square-wave generating step.

2. The method in accordance with claim 1 wherein a closing operation to the OFF-state of the transistor causes a voltage across the first inductor to change polarity and the current through the second capacitor to change direction.

3. The method in accordance with claim 2 wherein the controlled base current $I_{BN}$ is set on a collector junction of the transistor remaining in saturation until the controlled base current is approximately twice the anticipated maximum ON-state current $I_{CN}$.

4. The method in accordance with claim 2:
   wherein the controlled base current equals $V_S/Z_{BE}$ with $V_S$ as the first power source and $Z_{BE}$ as a characteristic impedance of the second circuit; and
   wherein a collector-emitter voltage of the transistor remains in saturation near zero until the collector current reaches a value, $2I_{CN}$ which is $\beta$ times the controlled base current.

5. The method in accordance with claim 2 said method further comprising the step of choosing the controlled base current for establishing conditions $I_{CN} = \beta I_{BN}/2$ and $V_{CEF} = V_{CEA}/2$ wherein $I_{BN} = V_{CEA}/(\beta Z_0)$.

6. The method in accordance with claim 5 said method further including the steps of:
   equalizing peak-to-peak collector current modulation with a maximum saturation current; and
   equalizing peak-to-peak collector voltage modulation with a collector breakdown voltage such that maximum utilization results for dynamic characteristics of the transistor.

7. The method in accordance with claim 6 wherein the second circuit presents a matched termination to the square wave thereby allowing the second circuit to be used as a matched termination for a uniform transmission line of any length.

* * * * *